United States Patent
Toyota et al.

(10) Patent No.: US 9,644,057 B2
(45) Date of Patent: May 9, 2017

(54) RESIN COMPOSITION AND METHOD FOR MANUFACTURING THE SAME

(71) Applicant: Panasonic Intellectual Property Management Co., Ltd., Osaka (JP)

(72) Inventors: Kei Toyota, Osaka (JP); Kazuma Oikawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 48 days.

(21) Appl. No.: 14/686,954

(22) Filed: Apr. 15, 2015

(65) Prior Publication Data

US 2015/0299465 A1  Oct. 22, 2015

(30) Foreign Application Priority Data

Apr. 17, 2014  (JP) .................................. 2014-085171
Mar. 9, 2015  (JP) .................................. 2015-046350

(51) Int. Cl.
   *C08F 220/18*  (2006.01)
   *C08G 65/22*  (2006.01)
   *H01L 33/56*  (2010.01)

(52) U.S. Cl.
   CPC ............ *C08F 220/18* (2013.01); *C08G 65/22* (2013.01); *H01L 33/56* (2013.01); *H01L 2224/32245* (2013.01); *H01L 2224/48091* (2013.01); *H01L 2224/48247* (2013.01); *H01L 2224/48257* (2013.01); *H01L 2224/73265* (2013.01); *H01L 2224/92247* (2013.01); *H01L 2924/181* (2013.01)

(58) Field of Classification Search
None
See application file for complete search history.

(56) References Cited

U.S. PATENT DOCUMENTS

| 8,415,685 B2 | 4/2013 | Fujita et al. |
| 8,809,480 B2 | 8/2014 | Kusunoki et al. |
| 2004/0097014 A1* | 5/2004 | Musa ............... C09J 201/10 438/118 |
| 2006/0040108 A1* | 2/2006 | Wang ............... C08G 77/16 428/413 |

(Continued)

FOREIGN PATENT DOCUMENTS

| JP | 2011/108899 | 6/2011 |
| JP | 2012-241059 | 12/2012 |

(Continued)

OTHER PUBLICATIONS

Donescu et al. "Hybrid materials obtained in microemulsion from methyl methacrylate, methacryloxypropyltrimethoxysilane, tetraethoxysilane" European Polymer Journal 35, 1999, 1679-1686.*

*Primary Examiner* — Robert S Loewe
(74) *Attorney, Agent, or Firm* — Wenderoth, Lind & Ponack, L.L.P.

(57) ABSTRACT

An alkoxysilane containing reactive organic functional groups is prepared as one of raw materials. The reactive organic functional groups are caused to react to bond with each other in advance so as to form an oligomer. The oligomer is swollen in an alkoxysilane of an identical or different kind, so that a sol solution is prepared and the sol solution is cured through a sol-gel reaction.

13 Claims, 16 Drawing Sheets

(56) References Cited

U.S. PATENT DOCUMENTS

| | | | |
|---|---|---|---|
| 2006/0230476 A1* | 10/2006 | Atanasoska | A61L 29/12 604/93.01 |
| 2009/0240072 A1* | 9/2009 | Buck | B01F 5/104 556/413 |
| 2011/0114929 A1 | 5/2011 | Fujita et al. | |
| 2013/0181167 A1 | 7/2013 | Kusunoki et al. | |

FOREIGN PATENT DOCUMENTS

| | | |
|---|---|---|
| JP | 2013-91778 | 5/2013 |
| JP | 2013-144757 | 7/2013 |

* cited by examiner

RESIN COMPOSITION AND METHOD FOR MANUFACTURING THE SAME

CROSS REFERENCE TO RELATED APPLICATIONS

The present application is based on and claims priority of Japanese Patent Application No. 2014-085171 filed on Apr. 17, 2014 and priority of Japanese Patent Application No. 2015-046350 filed on Mar. 9, 2015. The entire disclosures of the above-identified applications, including the specifications, drawings and claims are incorporated herein by reference in their entirety.

BACKGROUND OF THE INVENTION

1. Field of the Invention

The present disclosure relates to resin compositions each having high gas barrier properties and a clarity, and can be prepared easily, and methods for manufacturing the same.

2. Description of the Related Art

Recent years have seen increasing demands for light-source semiconductor devices such as light-emitting diodes (LEDs) each having a higher density and provides a higher output. For this reason, load voltages to such light-source semiconductor devices are on the increase. The increase in load voltage increases the temperature of resin portions that seal the light-source semiconductor devices. As a result, water and gases around the light-source semiconductor devices become easy to invade into the resin portions that seal the light-source semiconductor devices due to diffusion and infiltration. For this reason, migration and corrosion of the plated portions frequently occur. Such decrease in the reliability of light-source semiconductor elements is regarded as a problem.

In view of this, it is important to design cooling structures of packages in which light-source semiconductor elements are mounted. LEDs suffer from a problem other than the decrease in the reliability of the light-source semiconductor elements. The colors of silver-plated reflector portions around the light-source semiconductor elements are changed due to invaded sulfide gases. This causes the problem of decrease in light emission efficiency.

Japanese Unexamined Patent Application Publication No. 2011-108899 proposed, as a structure that solves the problem, a structure in which an LED package is covered by glass as illustrated in the cross-sectional view of FIG. 1.

More specifically, the structure includes: substrate 100, light-source semiconductor element 101 mounted on substrate 100; sealing resin 109 that covers light-source semiconductor element 101, and resin 102 that holds light-source semiconductor element 101 and sealing resin 109. The structure further includes: plate glass 103 on sealing resin 109; and silicone resin 104 containing phosphors above plate glass 103.

The structure can reduce water and gases that invade to sealing resin 109 by plate glass 103.

Japanese Unexamined Patent Application Publication No. 2013-091778, sealing resin is a thermosetting polysiloxane composition made of a compound obtained by condensing a polyorganosiloxane and a polydimethylsiloxane using a gallium compound. This composition increases the gas barrier properties of the structure.

Japanese Unexamined Patent Application Publication No. 2013-144757 protects such a structure using, as sealing resin, a silicone resin containing a hydrogen polyorganosiloxane having a ladder structure.

Japanese Unexamined Patent Application Publication No. 2012-241059 protects such a structure using, as sealing resin, a resin composition comprising a siloxane containing glycidoxy groups and a glycidoxy compound.

SUMMARY OF THE INVENTION

However, the structure illustrated in FIG. 1 of Japanese Unexamined Patent Application Publication No. 2011-108899 is formed through a process of applying a resin-containing phosphors to plate glass 103 and a process of mounting plate glass 103 on a package mold, and increases the manufacturing cost by the cost required to use plate glass 103.

On the other hand, the skeleton of a sealing resin in each of Japanese Unexamined Patent Application Publication No. 2013-091778, Japanese Unexamined Patent Application Publication No. 2013-144767, and Japanese Unexamined Patent Application Publication No. 2012-241059 have only siloxane structures. For this reason, the structures do not have sufficient gas barrier properties. Sealing resin 109 does not have a sufficient adherence with substrate 100, either. Thus, sealing resin 109 comes off and thereafter cannot provide sufficient gas barrier properties, with decrease in the reliability.

In view of this, the present disclosure relates to resin compositions having a high clarity, high gas barrier properties, and a high adherence. The present disclosure also provides methods for easily manufacturing protective films at room temperatures using less constituents.

A resin composition according to an aspect of the present disclosure is a resin composition including: an oligomer of a first metal alkoxide containing a reactive organic functional group, the oligomer being formed through polymerization of the reactive organic functional group; a second metal alkoxide of at least one kind; and a siloxane skeleton of the oligomer and the second metal alkoxide.

Here, as one of raw materials of the resin composition, it is possible to use an oligomer obtained by polymerizing only reactive organic functional groups in advance in a liquid of an alkoxysilane containing reactive organic functional groups of at least one kind.

For example, a glycidoxypropyl group can be used as a reactive organic functional group, and the oligomer can be obtained by adding a catalyser such as an amine to an alkoxysilane liquid as necessary.

Furthermore, the oligomer is dissolved or swollen in an alkoxysilane that is the same in kind as the one of the raw materials of the oligomer or an alkoxysilane that is different in kind, so that a sol solution is prepared. The sol solution comes in contact with heat, light, and water in the atmosphere, so that the sol solution is cured to be the resin composition that has a high clarity and gas barrier properties.

Here, an alkoxysilane is obtained by replacing hydrogen in hydroxyl groups of an alcohol with silicon.

A metal alkoxide is obtained by replacing hydrogen in hydroxyl groups of an alcohol with metal.

The semiconductor device according to an aspect of the present disclosure has a structure in which a substrate on which light-source semiconductor element 10 is mounted is sealed and protected by a protective film made of the resin composition. The semiconductor device is highly reliable because light-source semiconductor element 10 is protected by the protective film that prevents water and sulfide gases from diffusing and invading via the resin composition.

The resin composition according to an aspect of the present disclosure is a polymer having a high crosslinking density because the resin composition has (i) a skeleton structure in which reactive organic functional groups are polymerized and (ii) a skeleton structure in which alkoxy groups are polymerized. The reactive organic functional groups contain, as one or more row materials, one or more metal alkoxides of at least one kind having reactive organic functional groups.

As a result, it is possible to provide the resin composition having a high clarity, high gas barrier properties, and a high adherence. Furthermore, the present disclosure can provide methods for easily manufacturing the resin composition at a room temperature using less constituents. The semiconductor device manufactured using the resin composition is light-source semiconductor element 10 having a long life.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE PREFERRED EMBODIMENTS

Hereinafter, embodiments are described in detail with reference to the drawings. The respective embodiments are examples, and the present disclosure is not limited to these embodiments.

First Embodiment

Figure 1:
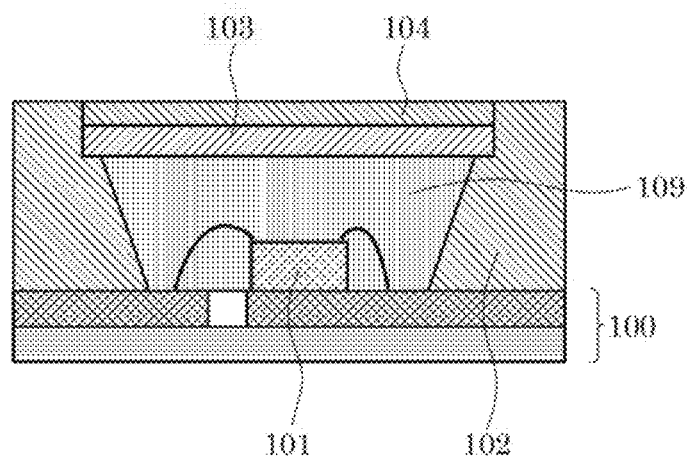
FIG. 1 is a cross-sectional view of a conventional example.
Figure 2:
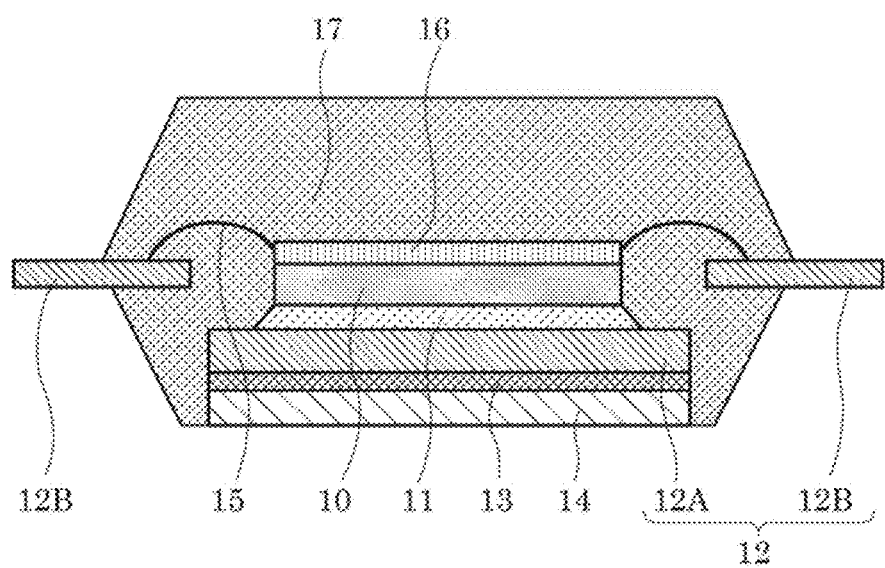
FIG. 2 is a cross-sectional view of a semiconductor device according to a first embodiment.

FIG. 2 is a cross-sectional view of a structure of a semiconductor device according to a first embodiment. The semiconductor device according to the first embodiment includes: lead frame 12 having at least die pad portion 12A and external terminal 12B; paste material 11; light-source semiconductor element 10; metal wire 15 that connects light-source semiconductor element 10 and external terminal 12B; cooling plate 14; bonding material 13 that bonds cooling plate 14 and die pad portion 12A; resin composition 16 that covers at least light-source semiconductor element 10; and sealing resin 17.

Lead frame 12 is made of materials having an excellent thermal conductivity and electric conductivity. Light-source semiconductor element 10 is mounted on die pad portion 12A via paste material 11.

Sealing resin 17 contains, for example, an ortho-crezol novolac based epoxy resin as a major component, a phenol resin as a curative, an accelerator, and a pigment such as carbon black. It is possible to use, as sealing resin 17, a thermosetting epoxy resin in which an inorganic filler is mixed to have a concentration of around 70 weight percent to 90 weight percent.

As constituent materials of cooling plate 14, carbon materials such as metal, ceramic, graphite, and diamond are suitable.

Bonding material 13 is either a sheet thermosetting bonding material or a liquid thermosetting bonding material. For example, bonding material 13 contains: an ortho-crezol novolac based epoxy resin as a major component; an acid anhydride as a curative; and an accelerator. It is possible to use a thermosetting epoxy resin in which an inorganic filler is mixed in a concentration of around 50 weight percent to 90 weight percent.

Resin composition 16 covering light-source semiconductor element 10 is described below in detail.

Resin Composition 16

Resin composition 16 is a polymer formed through polymerization of a metal alkoxide of at least one kind and prepared using a sol-gel method. The metal alkoxide of the at least one kind contains reactive organic functional groups.

Here, the reactive organic functional groups have a property of chain-polymerizing through anion polymerization, cation polymerization, radial polymerization, etc. due to heat and light.

The reactive organic functional groups are mutually polymerized through a polymerization reaction, in addition to crosslinking by dehydrative condensation between hydroxyl groups made from a metal alkoxide. Resin composition 16 as a whole is formed to have a three-dimensional network polymer structure, and thus has a high crosslinking density.

Resin composition 16 does not allow air to pass through, and can thus protect the semiconductor element against water and corrosive gases in this embodiment. Resin composition 16 has a refractive index of approximately 1.4 to 1.5 and has a high clarity. Thus, resin composition 16 is also applicable to a light-source semiconductor device. In an exemplary structure below, the metal alkoxide is an alkoxysilane, and the numbers of alkoxyl groups thereof is 3.

As a preferred example, resin composition 16 includes: an oligomer of a first metal alkoxide containing a reactive organic functional group, the oligomer being formed through polymerization of the reactive organic functional group; a second metal alkoxide of at least one kind; and a siloxane skeleton of the oligomer and the second metal alkoxide.

More specifically, resin composition 16 contains: an oligomer formed using, as a starter, a first alkoxysilane containing reactive organic functional groups represented according to Chemical Formula 1; a second alkoxysilane; and a siloxane skeleton of the oligomer and the second alkoxysilane. The oligomer is represented according to Chemical Formula 2. Y' denotes a polymerized structure of Y, and R denotes an alkyl group.

[Chemical Formula 1]

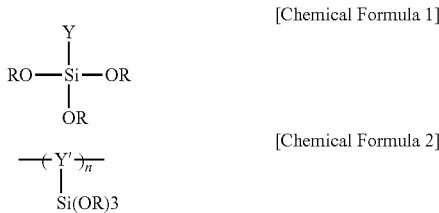

[Chemical Formula 2]

$-(Y')_n-$
|
Si(OR)3

Method for Manufacturing Resin Composition 16

(1) Raw Material

A raw material that is a starter of resin composition 16 is a first alkoxysilane containing reactive organic functional groups of at least one kind. Resin composition 16 is a resin composition having a siloxane skeleton as a frame, and a cured body in which reactive organic functional groups bonded with silicon atoms in the siloxane skeleton are polymerized through a polymerization reaction.

An alkoxysilane containing non-reactive organic functional groups may be included as an initiator. Resin composition 16 is formed in a liquid phase according to a sol-gel method, through the reaction of reactive organic functional groups bonded with silicon atoms of the alkoxysilane and succeeding hydrolysis and dehydrative condensation of alkoxy groups.

The reactive organic functional groups are non-limiting examples, and may be replaced with any other kind of reactive organic functional groups that are polymerized through a polymerization reaction due to light, heat, etc., or a combination of several kinds of reactive organic functional groups.

However, as an exemplary structure in the first embodiment, the reactive organic functional group is a glycidoxypropyl group (Chemical Formula 3), and the alkoxy group is a glycidoxypropyltrimethoxysilane that is a methoxy group.

[Chemical Formula 3]

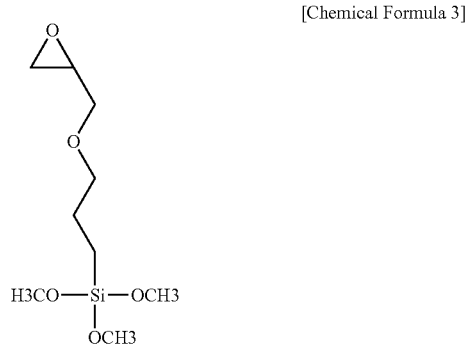 [SMILES: CO[Si](CCCOCC1CO1)(OC)OC]

(2) Transformation to Oligomer and Preparation of Sol Solution

First, a glycidoxypropyltrimethoxysilane as a first alkoxysilane is caused to polymerize through ring-opening polymerization of glycidoxy groups in the glycidoxypropyltrimethoxysilane in the presence of a basic catalyst having a low concentration, so as to prepare an oligomer (Chemical Formula 4).

[Chemical Formula 4]

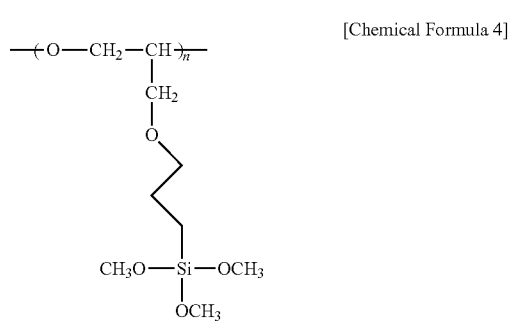

Next, a second alkoxysilane is added to the oligomer. When the oligomer is in a gel state, the oligomer is swollen in the second alkoxysilane to be transformed into a swelling liquid. An acid catalyst may be added to accelerate hydrolysis of the alkoxy groups. The liquid prepared according to the above method is a sol solution.

(3) Application and Curing

The sol solution prepared in this way is applied to light-source semiconductor element 10 mounted on lead frame 12 (FIG. 2) in advance, and is dried in the atmosphere. After the application, the liquid is exposed to water in the atmosphere, which accelerates the hydrolysis of the alkoxy groups in the sol solution and a dehydrative condensation reaction of silanol groups resulting from the hydrolysis. In this way, the sol is transformed into gel that is resin composition 16.

First Metal Alkoxide

Here, the first metal alkoxide is a metal alkoxide represented as $X_p\ Y_q\ ZrM\ (OR1)_l\ (OR2)_m\ (OR3)_n$. In view of presence of reactive organic functional groups, the following are suitable.

In the above chemical formula, each of p, q, r, l, m, and n denotes an integer, each of (p+q+r) and (l+m+n) denotes an integer ranging from 1 to 3, (p+q+r+l+m+n)=4, and M denotes a metal atom represented by silicon, titanium, aluminium, zirconium, tin, etc. Compositions with metal alkoxy groups are suitable in view of easy control of a sol-gel reaction.

At least one of X, Y, and Z is a reactive organic functional group in view of the capability of forming an oligomer. For example, the reactive organic functional group can be: a cyclic ether containing structure such as a glycidoxypropyl group, and an epoxy cyclohexyl group, and a group containing a derivative of any of them; a styryl group, an acrylate group, a methyl methacrylate group, a vinyl group, an alkynyl group, a derivative having a double or triple bonded structure of any of them, or a group containing any of them; or a thiol propyl group, an amino propyl group, or the like. In addition, a group that is not a reactive organic functional group among the X, Y, Z can be, for example, a hydrocarbon radical having a carbon number of 1 to 10, without being limited thereto. This is because it is difficult to form an oligomer using a functional group having a carbon number of 11 or above that causes steric hindrance and inhibits polymerization when the oligomer and a metal oxide skeleton are formed through the polymerization. More specifically, examples of such a functional group include: a methyl group, an ethyl group, a propyl group, a butyl group, a pentyl group, a hexyl group, a phenyl group, and a derivative of any of them; a cyclohexyl group, a heptyl group, an octyl group, a nonyl group, a decyl group; and a hydrocarbon radical of an isomer having a cyclic structure of any of them.

It is possible to arbitrarily select one of reaction inducing methods such as a photoreaction, a thermal reaction, and a combination thereof, etc.

In addition, two or more kinds of these functional groups may be used at the same time. In particular, a thiol propyl group and an amino propyl group can cause polymerization of a glycidoxypropyl group, and thus can be suitably mixed and used with the glycidoxypropyl group.

Polymerization of resin compositions 16 having different functional groups in separate cases are described below.

In the case of an alkoxysilane, polymerization is caused by dehydrative condensation of silanol groups generated by hydrolysis of alkoxy groups. However, when functional groups are bonded with the molecules of the alkoxysilane, these functional groups are polymerized apart from dehydrative condensation of the silanol groups. Thus, resin composition 16 that is finally formed has a high crosslinking density, and does not easily allow passage of molecules of oxygen, water, corrosive gases represented by a hydrogen sulfide.

In the case of glycidoxypropyl groups, it is possible to form a polyether structure by ring-opening polymerization of three-membered rings by heating, or adding, for example, an appropriate catalyst such as an amine. In the case of styryl groups, acrylate groups, methyl methacrylate groups, vinyl groups, and derivatives thereof, it is possible to form a polyolefin structure in resin composition 22 through radical polymerization. In the case of thiol propyl groups and amino propyl groups when co-used with glycidoxypropyl groups, it is possible to accelerate polymerization of the glycidoxypropyl groups.

R1, R2, and R3 can be alkyl groups each having a carbon number of 1 to 5 in view of the capability of forming a metal oxide skeleton. Specific examples include methyl groups, ethyl groups, propyl groups, isopropyl groups, butyl groups, pentyl groups, and isomers thereof etc. Among these groups, methyl groups and ethyl groups are suitable because they facilitate hydrolysis and reaction control.

Second Alkoxysilane

A second alkoxide may be identical to the first alkoxysilane or a metal alkoxide that can be represented as $E_p F_q G_r M(OR1)_l (OR2)_m (OR3)_n$ where (i) p, q, r, l, m, and n are each an integer, (ii) (p+q+r) and (l+m+n) are each an integer of 1 to 3, (iii) p+q+r+l+m+n=4. Here, M denotes a metal atom of silicon, titanium, aluminium, zirconium, or stannum.

An alkoxy group in the second alkoxysilane is necessary for forming a metal oxide skeleton of an oligomer formed with the first metal alkoxide. Thus, it is suitable that R1, R2, and R3 be each an alkyl group having a carbon number of 1 to 5 in the same manner as described above. E, F, and G can be a carbon hydride having a carbon number of 1 to 10, without being limited thereto. This is because it is difficult to form a polymer using a functional group having a carbon number of 11 or larger because such a functional group causes steric hindrance and inhibits polymerization when a resin composition is formed through the polymerization. In addition, in order to facilitate dissolution or swelling of the oligomer formed with the first metal alkoxide, from the perspective of chemical stability, specific examples of functional groups include: a methyl group, an ethyl group, a propyl group, an isopropyl group, a butyl group, a pentyl group, a hexyl group, a phenyl group, and a derivative of any of them: a cyclohexyl group, a heptyl group, an octyl group, a nonyl group, a decyl group, a carbon hydrocarbon radical of an isomer of any of them having a cyclic structure, etc. In the case of a second alkoxysilane containing functional groups that are not chemically stable, the functional groups are bonded with each other, and the second alkoxysilane is to be an oligomer. This makes it difficult to dissolve or swell the oligomer formed with the first metal alkoxide.

In addition, the second metal alkoxide may be a mixture of two or more kinds of metal alkoxides that satisfy the above conditions.

Method for Manufacturing Semiconductor Device

Figure 3:
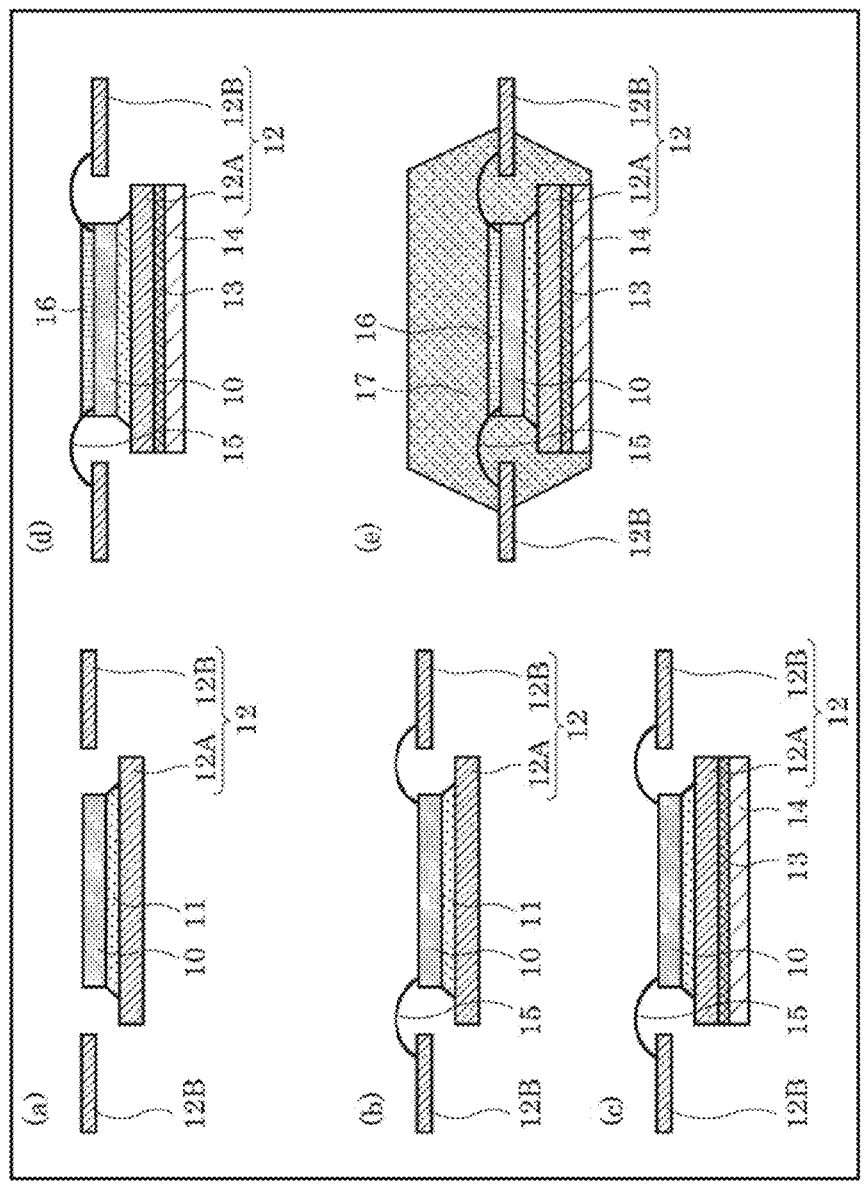
In FIG. 3, each of (a) to (e) is a cross-sectional view of components to be assembled in an assembling process included in a manufacturing method according to the first embodiment.

As a manufacturing method according to the first embodiment, for example, the next-described manufacturing method is possible. In FIG. 3, (a) to (e) are each a cross-sectional view of components to be assembled in an assembling process included in the manufacturing method according to the first embodiment.

First, an oligomer is prepared from an alkoxysilane having a reactive organic functional group that is the first alkoxysilane. Next, the second alkoxysilane is added to the oligomer, and thereby a sol solution is prepared.

A specific manufacturing method is described below.

(1) Preparation of Oligomer

As the first metal alkoxide, a mixed solution is prepared by mixing a glycidoxypropyltrimethoxysilane and an amine catalyser in the amounts of 30 g and 1 g, respectively. Here, the glycidoxypropyltrimethoxysilane has glycidoxy groups as reactive organic functional groups and contains silicon as a metal. The solution is left in a closed system for 24 hours at a room temperature, so as to accelerate polymerization of the glycidoxypropyl groups to be an oligomer.

The metal alkoxide is a non-limiting example, and metal atoms thereof may be replaced with titanium atoms, aluminium atoms, or the like. Other examples of reactive organic functional groups include: cyclic ether containing structures such as epoxycyclohexyl groups and groups containing a derivative of any of them; styryl groups, acrylate groups, methyl methacrylate groups, vinyl groups, alkynyl groups, and double or triple bonded structures thereof, and groups containing a derivative thereof thiol propyl groups, amino propyl groups, etc; and a combination of two or more kinds thereof.

Styryl groups, acrylate groups, methyl methacrylate groups, vinyl groups, and derivatives thereof are suitable because they can form a polyolefin structure and an acrylic resin structure in resin composition 22 through radial polymerization.

Thiol propyl groups and amino propyl groups when co-used with glycidoxypropyl groups are suitable because they can accelerate polymerization of the glycidoxypropyl groups.

There is no limitation to amine catalysers, and any amine catalyser that can cause ring-opening polymerization of the glycidoxy groups is possible. For example, the following are possible: (i) chain aliphatic amines including alkylamines such as an ethylenediamine, a diethylenetriamine, a triethylenetetramine, a tetraethylenepentamine, a dipropylenediamine, and a diethylaminopropyl amine; (ii) cyclic aliphatic amines including an N-aminoethylpiperazine, a menthenediamine, and an isophoronediamine; and (iii) aromatic amines including an m-xylenediamine, amine black, a methaphenylenediamine, a diaminodiphenylmethan, and a diaminodiphenyl sulfone.

(2) Preparation of Sol Solution

As the second metal alkoxide, a mixture of a dimethyldiethoxysilane of 17.7 g and a phenyltrimethoxysilane of 12.2 g is added to an oligomer of 22 g at a room temperature, and is then left in a closed system for 24 hours, so that a sol solution is prepared.

(3) Assembling of Components

As in (a) of FIG. 3, an appropriate amount of paste material 11 is applied to die pad portion 12A of lead frame 12, and light-source semiconductor element 10 is mounted on paste material 11. A dispenser can be used in the application of paste material 11, and a die bonder can be used in the mounting of light-source semiconductor element 10.

Subsequently, as illustrated in (b) of FIG. 3, light-source semiconductor element 10 and external terminal 12B of lead frame 12 are electrically and mechanically joined using metal wire 15. A wire bonder can be used to connect metal wire 15.

Furthermore, as illustrated in (c) of FIG. 3, in lead frame 12, cooling plate 14 is adhered via sheet bonding material 13 on a surface opposite to a surface on which light-source semiconductor element 10 is mounted.

(4) Formation of Resin Composition 16

An appropriate amount of the sol solution is dropped at least on the surface of light-source semiconductor element 10, and the dropped sol solution is left for at least 1 hour in the atmosphere, so that the sol solution is cured. In the dropped sol solution, alkoxy groups made from an alkoxysilane that is one of the row materials is hydrolysed by water molecules in the atmosphere to be silanol groups, and the silanol groups are dehydrated and condensed to form a siloxane skeleton.

As a result, light-source semiconductor element 10 is to be covered by resin composition 16 that provides a high crosslinking density as a whole because of its three-dimensional network polymer structure that is a mixture of polymerization chains of the reactive organic functional groups formed in the preparation of the oligomer in the above (1) and the siloxane skeleton ((d) in FIG. 3).

(5) Resin Sealing

Next, in (e) of FIG. 3, a structure illustrated in (d) of FIG. 3 is disposed inside a sealing mold tool heated to an appropriate temperature, and epoxy sealing resin 17 is press-filled around the structure and is caused to be cured.

Through the manufacturing method, light-source semiconductor element 10 is covered by resin composition 16 having high gas barrier properties, so as to be protected from water and corrosive gases that diffused and invaded to sealing resin 17. In this way, light-source semiconductor element 10 is resistant to breakage, and is to be a semiconductor device having a high reliability and a long life.

Effects

In addition, with the above-described effects, it is possible to protect light-source semiconductor element 10 to have the long life, compared to the life of the light-source semiconductor element that is not covered by resin composition 16. When a drive voltage of 600 V is being applied to the light-source semiconductor element without resin composition 16 at a temperature of 85 degrees Celsius and a humidity of 85 percent, the light-source semiconductor element does not have a short current until 450 hours has passed. On the other hand, light-source semiconductor element 10 protected by resin composition 16 according to this embodiment does not have a short current until 1200 hours or more has passed under the same conditions.

Evaluation of Resin Composition 16

Resin composition 16 according to this embodiment was evaluated, and the result is indicated below.

(1) Transmittance

Figure 4:
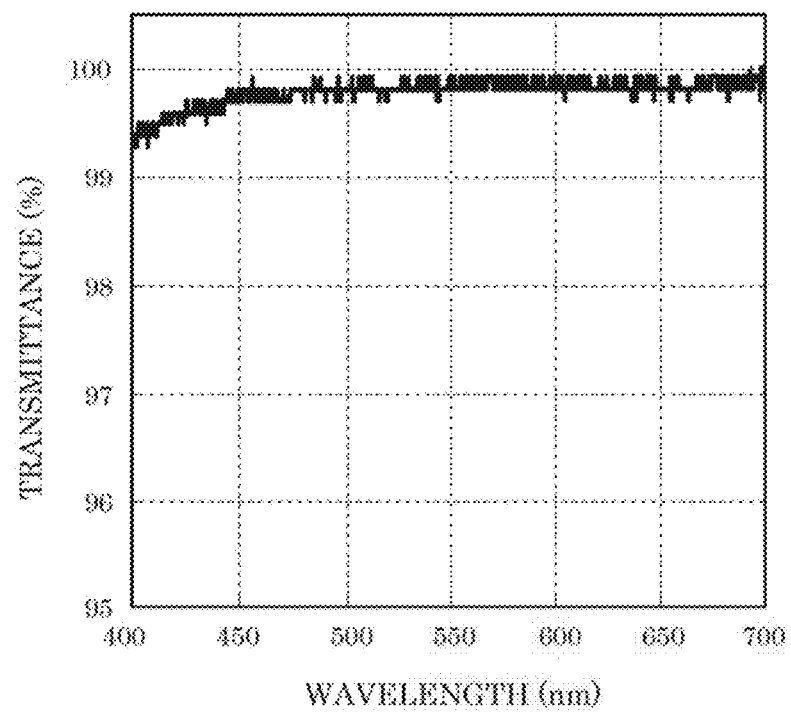
FIG. 4 is a graph of transmittance of a resin composition according to the first embodiment.

The sol prepared in the first embodiment was cured on a glass substrate, to have a thickness of 500 μm. FIG. 4 illustrates a transmittance spectrum of this sol. In FIG. 4, the horizontal axis denotes wavelengths of light, and the vertical axis denotes transmittance. In a visible region of wavelengths from 450 nm to 700 nm, the transmittance of the sol was 99.8 percent or more. The sol had a high clarity. The sol can be used in applications that require clarity. The sol can also be used as a sealing material for an LEI) as indicated below.

(2) FT-IR

Figure 5:
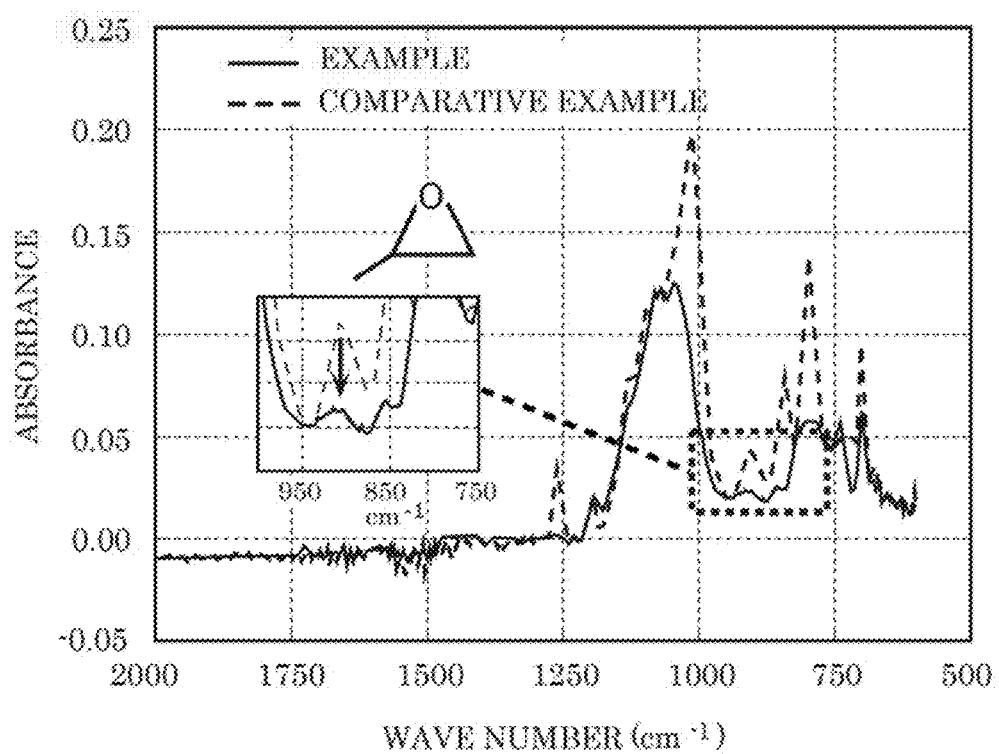
FIG. 5 is a graph of FT-IR of the resin composition according to the first embodiment and FT-IR of a resin composition in a comparative example.

The sol prepared in the first embodiment was cured on the glass substrate. Measurements were performed on the surface of resin composition 16 prepared to have a thickness of 500 μm according to Fourier Transform Infrared Spectroscopy (abbreviated as FT-IR). The result is shown in FIG. 5. In FIG. 5, the horizontal axis denotes wave numbers of infrared, and the vertical axis denotes absorbance. The example shows resin composition 16 prepared in the first embodiment. A comparative example shows a composition obtained by (i) mixing a phenyltrimethoxysilane and a dimethyldiethoxysilane in the same amounts as those in the example without transforming a glycidoxypropyltrimethoxysilane to an oligomer in advance, (ii) adding acetic acid of 0.2 ml to the mixture, and (iii) thermosetting the composition.

The example shows that the absorbance was decreased by 912 $cm^{-1}$ corresponding to cyclic ether in the glycidoxy groups, and the cyclic ether is ring-opened.

(3) Exposure Test Using Hydrogen Sulfide

Figure 6:
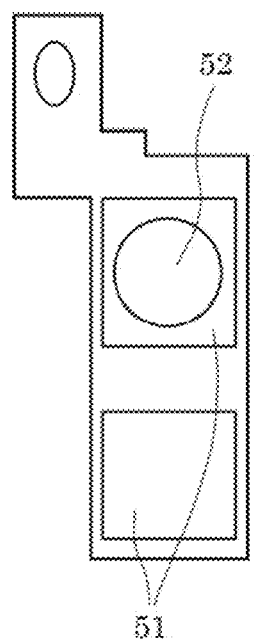
FIG. 6 is a plan view of a test sample according to the first embodiment.

FIG. 6 illustrates a plan view of cupper substrate 50 to be tested. The sol prepared in the first embodiment was applied as coating 52 on silver-plated surface 51 on cupper substrate 50, and was cured. The sol had a thickness of approximately 500 μm. Resin composition 16 prepared in this way is the example.

In addition, as coating 52, two-liquid mixture phenyl-modified silicone resin that is generally used was applied to silver-plated surface 51 of the same kind, and was cured. The sol had a thickness of approximately 500 μm. This resin composition is the comparative example.

Figure 7:
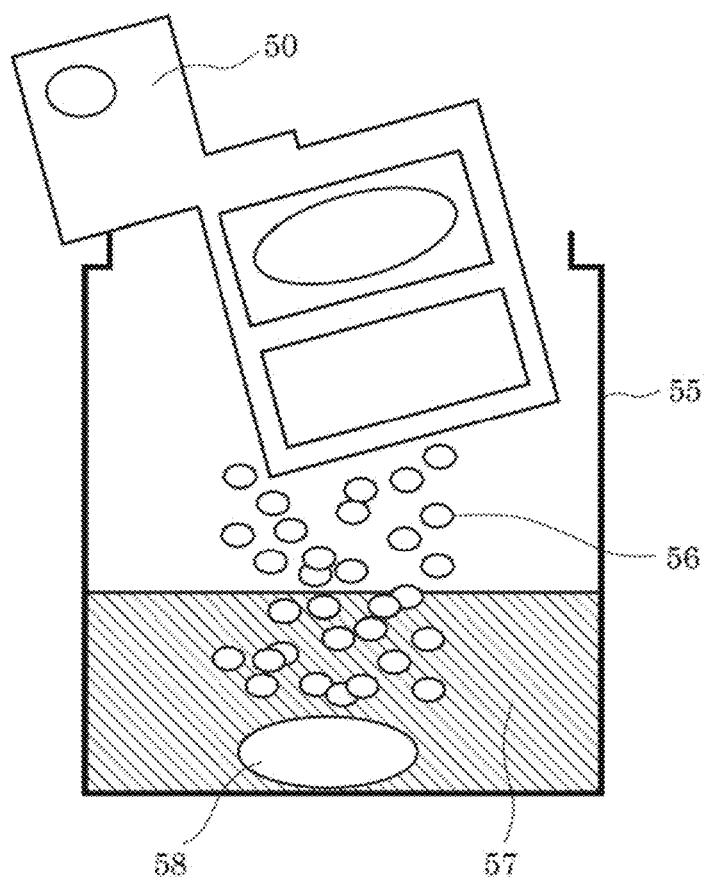
FIG. 7 is an illustration of a hydrogen sulfide exposure test according to the first embodiment.
Figure 8:
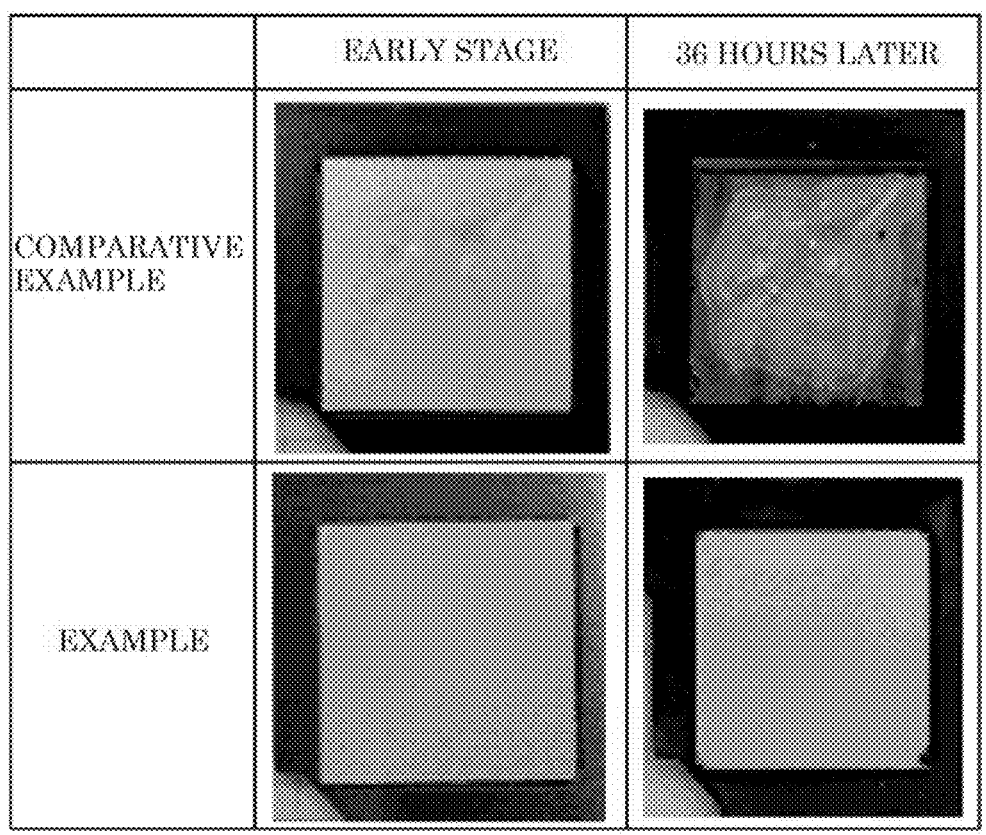
FIG. 8 shows results of the hydrogen sulfide exposure test according to the first embodiment.

FIG. 7 illustrates a test state. As illustrated in FIG. 7, iron sulfide 58 of 8.5 g and 12 normal hydrochloric acid 57 of 2.5 ml were injected to vial container 55 having an inner diameter of approximately 81 mm, and cupper substrate 50 was exposed to resulting hydrogen sulfide 66. Coating 52 in each of the example and the comparative example was exposed to hydrogen sulfide 56. Silver-plated surface 51 after elapse of 36 hours was observed. The results are shown in FIG. 8. The initial and 36-hours later states of silver-plated surface 51 in each of the comparative example and the example are shown.

In the comparative example, the color of silver-plated surface 51 covered with a resin was changed due to hydrogen sulfide 56. In contrast, the color of silver-plated surface 51 in the example did not change, verifying that the resin in the example has excellent gas barrier properties against hydrogen sulfide 56.

Second Embodiment

Figure 9:
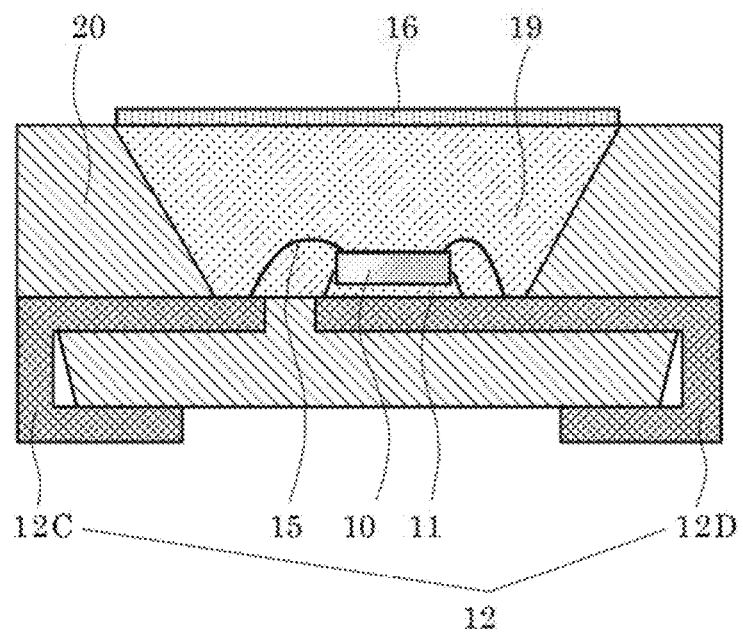
FIG. 9 is a cross-sectional view of a light-source semiconductor device according to a second embodiment.

FIG. 9 is a cross-sectional view of a structure of a light-source semiconductor device according to a second embodiment.

The second embodiment is different from the first embodiment in that resin composition 16 protects phosphor-containing sealing resin 19 in an LED what is called a light-source semiconductor device and in that a second alkoxysilane has a different composition. The second embodiment is the same as the first embodiment in the other points. The same points as in the first embodiment are not described repeatedly.

The semiconductor device according to the second embodiment includes: lead frame 12 having at least lead portion 12C and lead portion 12D; resin container 20 having a recessed portion; light-source semiconductor element 10 disposed inside resin container 20 and fixed to lead portion 12D via bonding material 13; metal wire 16 that electrically connects light-source semiconductor element 10 and lead portions 12C and 12D; phosphor-containing sealing resin 19 that covers light-source semiconductor element 10; and resin composition 16 that covers phosphor-containing sealing resin 19 so that phosphor-containing sealing resin 19 does not come in contact with the atmosphere.

Light-source semiconductor element 10 is mounted via paste material 11 on lead portion 12D at a place positioned on a bottom surface of the recessed portion of resin container 20. Electrodes thereof are connected to respective lead portions 12C and 12D via metal wire 16.

Light-source semiconductor element 10 is a light-emitting element such as an LED. Light-source semiconductor element 10 includes: a seed layer made of AlN formed above a sapphire substrate; a ground layer formed above the seed layer; and a laminated semiconductor layer made mainly of GaN. Light-source semiconductor element 10 has a light-emission 26 wavelength region of 430 nm to 500 nm inclusive.

Lead frame 12 is made of a material, such as cupper, having an excellent thermal conductivity and electrical conductivity, and has a surface that is a silver-plated layer. Accordingly, in the bottom surface of the recessed portion of resin container 20, the silver-plated layer is exposed at least partly in lead portions 12C and 12D. The silver-plated layer can be formed using a silver plating method.

Lead portion 12C and lead portion 12D are folded as illustrated in FIG. 9 for the purpose of mounting light-source semiconductor element 10 on the surface. Folding directions are directions toward the back side of resin container 20. The ends of folded lead frame 12 (lead portions 12C and 12D) are positioned at the back side of resin container 20.

Resin container 20 is, for example, a thermoplastic or thermosetting resin such as an acrylic resin, a polyvinyl chloride, a phenylene sulfide, a polyvinylidene, a polyamide, a polycarbonate, a polytetrafluoroethylene, a polystyrene, a polyurethane, an ABS resin, a liquid crystal polymer, a polyacetal resin, an epoxy resin, and nylon.

Resin container 20 is formed by molding in a shape to support lead portions 12C and 12D The polyamide, liquid crystal polymer, epoxy resin, polystyrene and nylon among these can be used preferably.

The resin that forms resin container 20 contains a white pigment, and the content and grain diameter, etc. of the white pigment are adjusted so that the photoreflectance of visible light falls within a range from 85% to 98% inclusive.

A photoreflectance smaller than 85% disables sufficient reflection of light emitted from an element, resulting in a low luminance.

In order to increase a photoreflectance to 98% or more, a larger amount of white pigment needs to be added, resulting in coalescence of white pigment grains. This makes it difficult to mold a resin container.

Examples of white pigments for use include zinc white, white lead, lithophone, a titania (titanium oxide), an aluminium oxide, a precipitated barium sulfate, barite powder, etc.

In particular, the titanium oxide can be suitably used as a white pigment because it has a high refractivity and a low absorbance.

Furthermore, in order to efficiently use light emitted from light-source semiconductor element 10, it is good to plate silver on the surface of the recessed portion.

As phosphor-containing sealing resin 19, it is possible to use a resin that passes light in a visible region. Examples include a silicone resin, an epoxy resin, an acrylic resin, etc. Among these, the silicone resin can be preferably used in view of resistance to light and heat.

In the second embodiment, it is only necessary that resin composition 16 obtained using, as a starter, one or more metal alkoxides of at least one kind containing reactive organic functional groups be disposed on phosphor-containing sealing resin 19. Resin composition 16 may contain phosphors, or may not contain any phosphor. With this structure, invasion of water and corrosive gases into phosphor-containing sealing resin 19 is reduced. In particular, when a corrosive gas is a sulfide gas such as a hydrogen sulfide, change in the color of silver-plated portions of lead frame 12 and silver-plated surface 51 of the recessed portion of resin container 20 is reduced, and thus the life of the light-emitting semiconductor device can be prolonged.

Method for Manufacturing Light-Source Semiconductor Device

As a manufacturing method according to the second embodiment, for example, the next-described manufacturing method is possible. Resin composition 16 and the manufacturing method thereof can be the same as in the first embodiment of the present disclosure.

Figure 10:
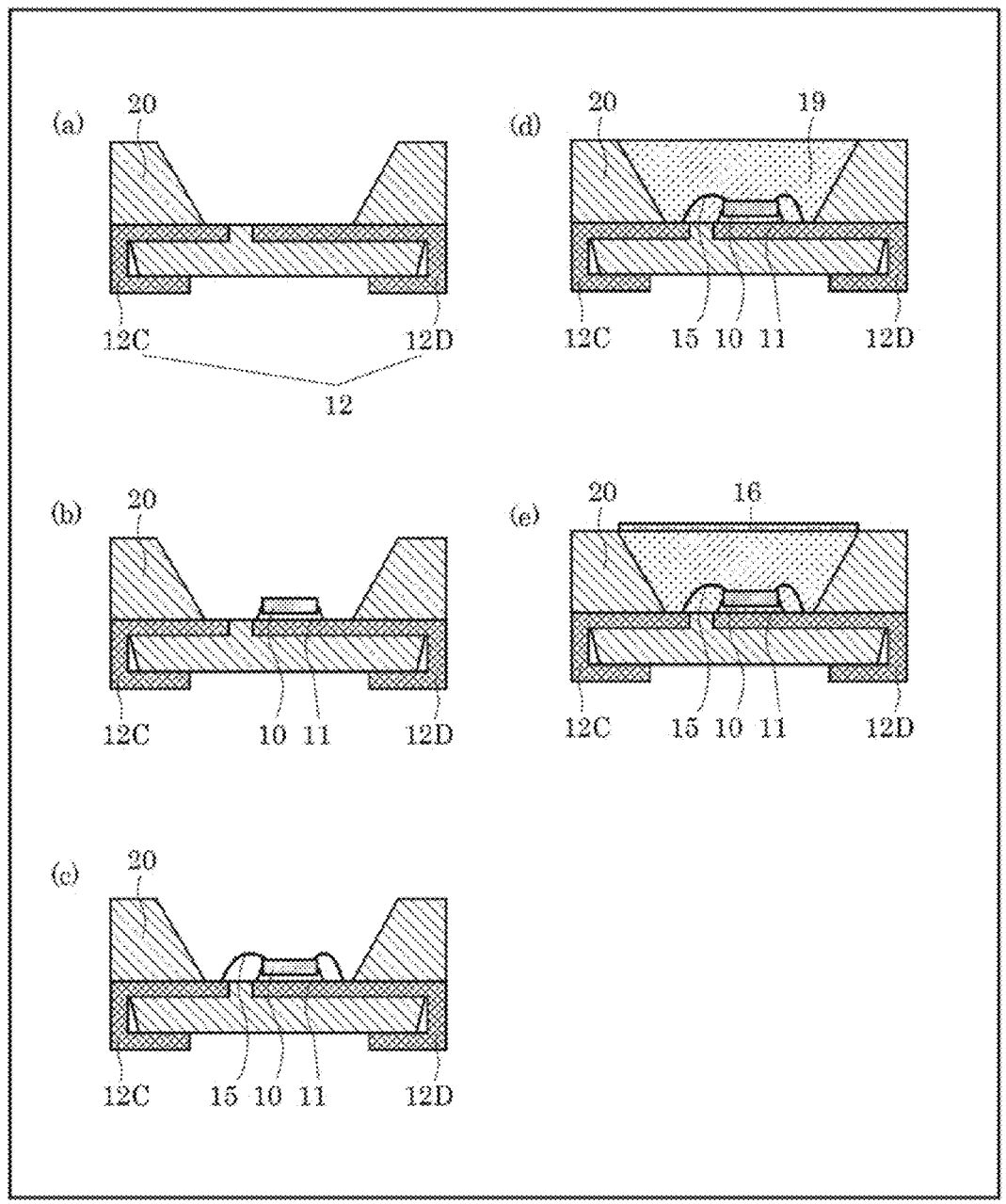
In FIG. 10, each of (a) to (e) is a cross-sectional view of components to be assembled in an assembling process included in a manufacturing method according to the second embodiment.

In FIG. 10, (a) to (e) are each a cross-sectional view of components to be assembled in an assembling process included in the manufacturing method in the second embodiment.

Resin Composition 16

First, an oligomer is prepared from an alkoxysilane having reactive organic functional groups. Next, a second alkoxysilane is added to the oligomer, and thereby a sol solution is prepared.

A specific manufacturing method is described below.

(1) Preparation of Oligomer

An oligomer is prepared in the same manner as in the first embodiment.

(2) Preparation of Sol Solution

As a second metal alkoxide, a dimethyldiethoxysilane of 17.8 g is added to an oligomer of 22 g at a room temperature, and is then left in a closed system for 24 hours, so that a sol solution is prepared.

Unlike the first embodiment, the second metal alkoxide contains only dimethyldiethoxysilane, and thus, the sol solution has a low viscosity. The even wetting extendibility of the sol solution on an application target can be increased.

As a replacement for the dimethyldiethoxysilane, a material having three or smaller number of alkoxy groups per molecule can be used as the second metal alkoxide so as to reduce interaction between alkoxy groups of an oligomer formed from a first metal alkoxide and alkoxy groups of the second metal alkoxide. In this way, a sol solution having a low viscosity can be prepared. Here, the second metal alkoxide may comprise two kinds of alkoxides.

(3) Assembling of Components

First, mold-injection of a white resin is performed as illustrated in (a) of FIG. 10 to form resin container 20 having a recessed portion in lead frame 12 into which silver-plated lead portions 12C and 12D are integrated. Next, in the bottom surface of the recessed portion of resin container 20, light-source semiconductor element 10 is mounted on lead portion 12D for a cathode via paste material 11 through curing of a die bond and paste material 11 ((b) of FIG. 10).

The electrodes of light-source semiconductor element 10 are respectively connected to lead portions 12C and 12D using metal wire 15 according to a wire bonding method ((c) of FIG. 10).

Next, paste material 11 that is a mixture of phosphors and an uncured sealing resin are filled in the recessed portion of resin container 20 by an appropriate amount using a dispenser. Subsequently, paste material 11 is thermoset to form phosphor-containing sealing resin 19 ((d) of FIG. 10).

(4) Formation of Resin Composition 16

A sol solution is dropped at places exposed to the atmosphere in an upper portion of phosphor-containing sealing resin 19, and is left in the atmosphere for at least 1 hour, so that the sol solution is cured. In the dropped sol solution, alkoxy groups made from an alkoxysilane that is one of row materials is hydrolyzed by water molecules in the atmosphere to be silanol groups, and the silanol groups are dehydrated and condensed to form a siloxane skeleton. As a result, phosphor-containing sealing resin 19 is to be covered by resin composition 16 that provides a high crosslinking density as a whole because of its three-dimensional network polymer structure that is a mixture of polymerization chains of reactive organic functional groups formed in the preparation of the oligomer in the above (1) and the siloxane skeleton ((e) in FIG. 10).

Through the above manufacturing method, the light-source semiconductor device is formed to have phosphor-containing sealing resin 19 covered by resin composition 16 having high gas barrier properties. As a result, the light-source semiconductor device can be protected against water and corrosive gases that diffuse and invade to phosphor-containing sealing resin 19, so that the light-source semiconductor device is resistant to (i) breakage due to such water and corrosive gases and (ii) change in the color of the silver-plated portions of lead portions 12C and 12D and silver-plated surface 51 of the recessed portion of resin container 20. Accordingly, the light-source semiconductor device can have a high reliability and a long life.

Effects

Furthermore, with the above effects, it is possible to maintain the light-emission intensity during the long life, compared to a light-source semiconductor device having phosphor-containing sealing resin 19 whose surface is not covered by resin composition 16. When the light-source semiconductor device (in a conventional example) having phosphor-containing sealing resin 19 whose surface is not covered by resin composition 16 is turned on at a temperature of 85 degrees Celsius and a humidity of 85%, the light-source semiconductor device maintains 90% of the light-emission intensity for 1200 hours. On the other hand, the light-source semiconductor device in this embodiment can maintain 90% of the light-emission intensity for 2000 hours under the same conditions.

Third Embodiment

Figure 11:
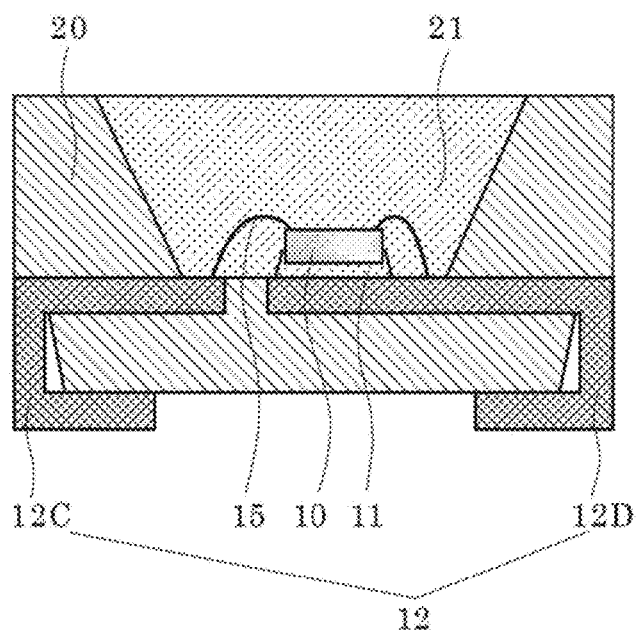
FIG. 11 is a cross-sectional view of a light-source semiconductor device according to a third embodiment.

FIG. 11 is a cross-sectional view of a structure of a light-source semiconductor device according to a third embodiment. The third embodiment is different from the second embodiment in that: a recessed portion of resin container 20 is filled with phosphor-containing resin composition 21 as a replacement for resin composition 16 and phosphor-containing sealing resin 19 in FIG. 9; an alkoxysilane containing reactive organic functional groups is an epoxy cyclohexylmethyldimethoxyl silane; and that a second alkoxysilane has a different composition. The other points are the same as in the second embodiment. The same points as in the second embodiment are not described repeatedly.

The semiconductor device according to the third embodiment includes: lead frame 12 including at least lead portions 12C and 12D; resin container 20 having a recessed portion; light-source semiconductor element 10 disposed inside resin container 20 and mounted on lead portion 12D via a die bond material; metal wire 15 that electrically connects semiconductor element 10 and lead portions 12C and 12D; and phosphor-containing resin composition 21.

In the third embodiment, phosphor-containing resin composition 21 is obtained using, as a starter, one or more alkoxysilanes of at least one kind containing reactive organic functional groups, and fills the recessed portion of resin container 2. With this structure, it is possible to reduce invasion of water and corrosive gases.

In particular, when a corrosive gas is a sulfide gas such as a hydrogen sulfide, it is possible to reduce change in the color of silver-plated portions of lead portions 12C and 12D and silver-plated surface 51 of the recessed portion of resin container 20, and to thereby prolong the life of the light-emitting semiconductor device.

In the second embodiment, resin composition 16 covers phosphor-containing sealing resin 19. On the other hand, in the third embodiment, since resin composition 21 having high gas barrier properties is used as the phosphor-containing resin, the light-emitting semiconductor device can have higher gas barrier properties and a longer life.

Method for Manufacturing Light-Source Semiconductor Device

Figure 12:
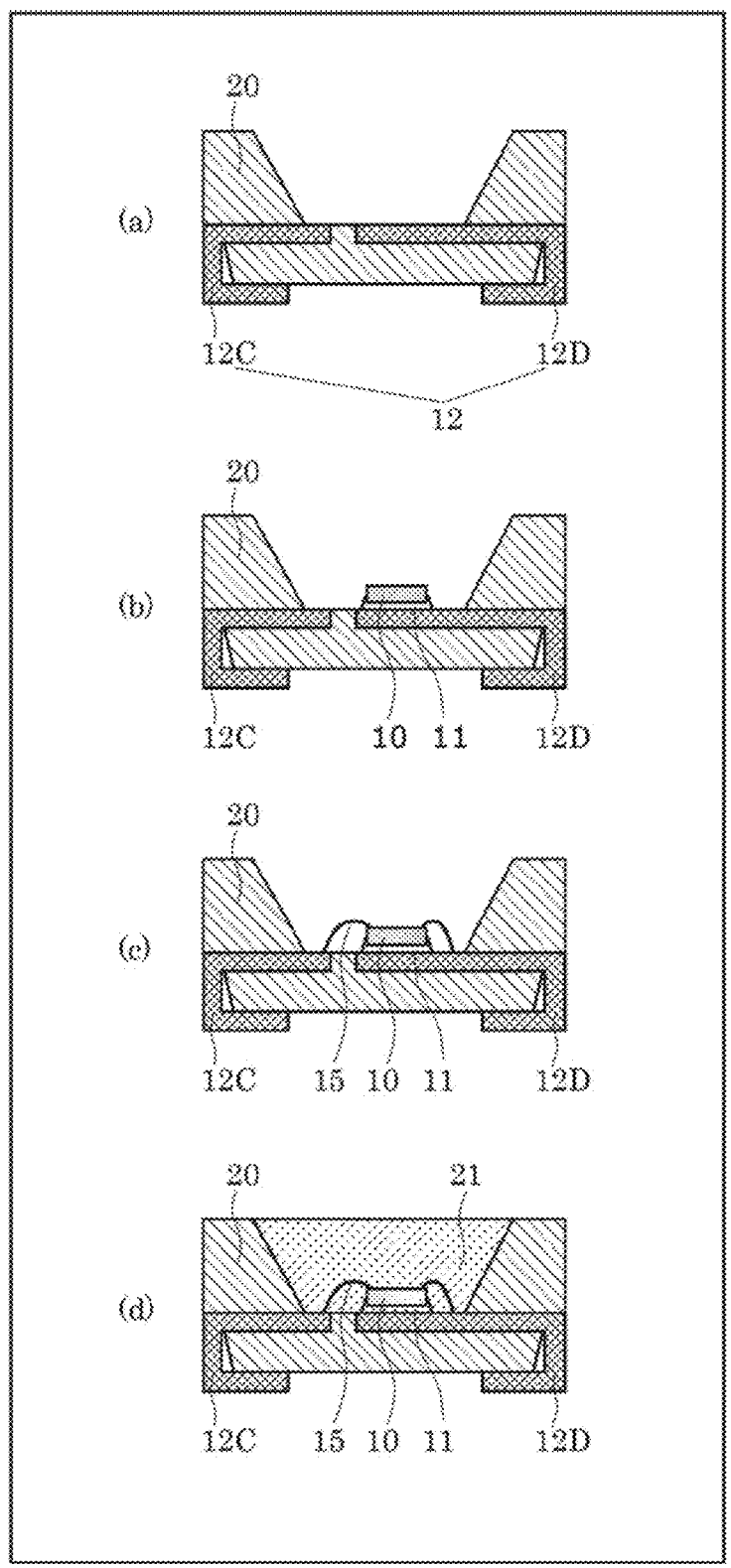
In FIG. 12, each of (a) to (d) is a cross-sectional view of components to be assembled in an assembling process included in a manufacturing method according to the third embodiment.

As a manufacturing method according to the third embodiment, for example, the next-described manufacturing method is possible. Resin composition 21 and the manufacturing method thereof can be the same as in the first embodiment of the present disclosure. In FIG. 12, (a) to (d) are each a cross-sectional view of components to be assembled in an assembling process included in a manufacturing method in the third embodiment.

Resin Composition 21

First, a method for manufacturing resin composition 21 is described. An oligomer is prepared from an alkoxysilane having a reactive organic functional group. Next, a second alkoxysilane is added to the oligomer, and thereby a sol solution is prepared. A specific manufacturing method is described below.

(1) Preparation of Oligomer

A mixed solution is prepared by mixing an epoxy cyclohexylmethyldimethoxyl silane containing glycidoxy groups as reactive organic functional groups and an amine catalyser in the amounts of 30 g and 1 g, respectively. The solution is left in a closed system for 96 hours at a room temperature, so as to accelerate polymerization of the epoxycyclohexyl groups to be an oligomer. The reactive organic functional groups may be replaced with cyclic ether such as glycidoxypropyl groups and groups containing derivatives thereof, styryl groups, acrylate groups, methyl methacrylate groups, vinyl groups, alkynyl groups, derivatives of any of them having a double or triple bonded structure and groups containing derivatives of any of them, thiol propyl groups, amino propyl groups, or the like, and may be a combination of two or more kinds thereof.

Styryl groups, acrylate groups, methyl methacrylate groups, vinyl groups, and derivatives thereof are suitable because they can form a polyolefin structure in a resin composition through radial polymerization. Thiol propyl groups and amino propyl groups when co-used with glycidoxypropyl groups are suitable because they can accelerate polymerization of the glycidoxypropyl groups.

There is no limitation to amine catalysers, and any amine catalyser that can cause ring-opening polymerization of the glycidoxy groups is possible. For example, any of the following are possible: (i) chain aliphatic amines including alkylamines such as an ethylenediamine, a diethylenetriamine, a triethylenetetramine, a tetraethylenepentamine, a dipropylenediamine, and a diethylaminopropyl amine; (ii) cyclic aliphatic amines including an N-aminoethylpiperazine, a menthenediamine, and an isophoronediamine; and (iii) aromatic amines including an m-xylenediamine, amine black, a methaphenylenediamine, a diaminodiphenylmethan, and a diaminodiphenyl sulfone.

(2) Preparation of Sol

As the second metal alkoxide, a mixture containing a phenyltrimethoxysilane of 29.9 g is added to an oligomer of 22 g at a room temperature, and is then left in a closed system for 24 hours, so that a sol solution is prepared.

(3) Mixing of Phosphors

Phosphors are added to and dispersed in a sol solution obtained in this way. It is possible to cause such dispersion according to a method using a rotary impeller, a magnetic stirrer, or the like. A volatile organic solvent may be added to increase dispersibility of the phosphors, so that a phosphor paste is prepared by mixing the phosphors in the sol solution.

The phosphors are non-limiting examples, and may be any other kind of inorganic or organic phosphors that are directly or indirectly excited by light emitted from the semiconductor light-emitting element and emit light having a different wavelength.

For example, it is possible to use at least one kind of phosphors having any of exemplary light-emission wavelengths below, and use at least two or more kinds thereof at the same time. It is possible to obtain a desired light-emission color by adjusting the kind(s) and the addition amounts of the phosphors as necessary.

The addition amount of the phosphors can be in a range from 5% to 50% with respect to the weight of the sol solution. When the addition amount of phosphors is smaller than 5%, the addition amount is insufficient, which makes it difficult to obtain the desired light-emission color. When the addition amount of phosphors is larger than 50%, the phosphors block light from the light source, resulting in decrease in the amount of light.

In addition, for the purpose of obtaining a white color in this embodiment, it is desirable to select yellow phosphors because the light-emission wavelength region ranges approximately from 430 nm to 400 nm inclusive and corresponds to a blue color, and because the yellow phosphors absorb the blue color and emit yellow fluorescence.

Blue Phosphors

Phosphors having a light-emission peak wavelength in a range of 420 nm to 470 nm inclusive can be selected as blue phosphors, and examples of suitable ones include (i) $(Sr, Ca, Ba, Mg)_{10}(PO_4)_6(Cl,F)_2:Eu$, $(Sr, Ca, Ba, Mg)_{10}(PO_4)_6(Cl, F)_2:Eu$, $(Ca, Sr, Ba)MgAl_{10}O_{17}:Eu$, $(Ba, Ca, Mg, Sr)_2SiO_4:Eu$, $(Ba, Ca, Sr)_3MgSi_2O_8:Eu$, and (ii) $(Ba, Sr)MgAl_{10}O_{17}:Eu$, $(Ca, Sr, Ba)_{10}(PO_4)_6(Cl, F)_2:Eu$, $Ba_3MgSi_2O_8:Eu$.

Green Phosphors

Phosphors having a light-emission peak wavelength in a range of 500 nm to 535 nm inclusive can be selected as green phosphors, and examples include β-sialon, $(Sr, Ba)_2SiO_4:Eu$, $Y_3(Al, Ga)_5O_{12}:Ce$, $CaSc_2O_4:Ce$, $Ca_3(Sc, Mg)_2Si_3O_{12}:Ce$, $(Ba, Sr)_3Si_6O_{12}:N_2:Eu$, $SrGa_2S:Eu$, $BaMgAl_{10}O_{17}:Eu, Mn$.

Yellow Phosphors

Phosphors having a light-emission peak wavelength in a range of 530 nm to 580 nm inclusive can be selected as yellow phosphors, and examples include $Y_3Al_5O_{12}:Ce$, $(Y, Gd)_3Al_5O_{12}:Ce$, $(Sr, Ca, Ba, Mg)_2SiO_4:Eu$, $(Ca, Sr)Si_2N_2O_2:Eu$, $(La, Y, Gd, Lu)_3(Si, Ge)_6N_{11}:Ce$.

Orange and Red Phosphors

Phosphors having a light-emission peak wavelength in a range of 570 nm to 680 nm inclusive can be selected as orange and red phosphors, and examples of suitable ones include (i) $(Ca, Sr, Ba)_2Si_5(N,O)_8:Eu$, $(Ca, Sr, Ba)Si(N, O)_2:Eu$, $(Ca, Sr, Ba)AlSi(N, O)_3:Eu$, $(Sr,Ba)_3SiO_5:Eu$, $(Ca, Sr)S:Eu$, $(La, Y)_2O_2S:Eu$, Eu $(dibenzoylmethane)_3$ 1,10-phenanthroline complex or the like that is 6-diketone Eu complex, acid-based Eu complex, $K_2SiF_6:Mn$, and (ii) $(Ca, Sr, Ba)_2Si_5(N, O)_8:Eu$, $(Sr, Ca)AlSi(N, O):Eu$, $(La, Y)_2O_2S:Eu$, $K_2SiF_6:Mn$.

In particular, suitable orange phosphors include $(Sr, Ba)_3SiO_5:Eu$, $(Sr, Ba)_2SiO_4:Eu$, $(Ca, Sr, Ba)_2Si_5(N, O)_8:Eu$, $(Ca, Sr, Ba)AlSi(N, O)_3:Ce$.

In this embodiment, $Y_3Al_5O_{12}:Ce$ that is a yellow phosphor is selected for the purpose of obtaining a white color through blue excitation, and the phosphor of 2.5 g with respect to the sol solution of 10 g is mixed.

(4) Assembling of Components

First, mold-injection of a white resin is performed as illustrated in (a) of FIG. 12 to form resin container 20 having a recessed portion in lead frame 12 into which silver-plated lead portions 12C and 12D are integrated. Next, in the bottom surface of the recessed portion of resin container 20, light-source semiconductor element 10 is disposed on lead portion 12D for a cathode via paste material 11 to be mounted thereon through curing of paste material 11 ((b) in FIG. 12). The electrodes of light-source semiconductor element 10 are respectively connected using metal wire 15 according to a wire bonding method ((c) of FIG. 12).

(5) Filling of Phosphor Paste

The phosphor paste is dropped and filled in the recessed portion of resin container 20 using a dropping device such as a dispenser, and is then cured. In the dropped phosphor paste, alkoxy groups made from an alkoxysilane that is a row material is hydrolysed by water molecules in the atmosphere to be silanol groups, and the silanol groups are dehydrated and condensed to form a siloxane skeleton.

As a result, resin composition 21 provides a high cross-linking density as a whole because of its three-dimensional network polymer structure that is a mixture of polymerization chains of reactive organic functional groups formed in the preparation of the oligomer in the above (1) and the siloxane skeleton. In addition, the recessed portion of the resin container is filled with phosphor-containing resin composition 21 ((d) in FIG. 12).

Effects

Through the above manufacturing method, the light-source semiconductor device is formed to have the sealing resin using resin composition 21 having high gas barrier properties. Thus, the light-source semiconductor device is protected against water and corrosive gases that diffuse and invade to phosphor-containing sealing resin 19, so that the light-source semiconductor device is resistant to (i) breakage due to such water and corrosive gases and (ii) change in the color of the silver-plated portions of lead portions 12C and 12D and silver-plated surface 51 of the recessed portion of resin container 20. Accordingly, the light-source semiconductor device can have a high reliability and a long life.

With the effects, light-source semiconductor element 10 has a light emission intensity maintained during the long life, compared to a light-source semiconductor element in which a resin does not have high gas barrier properties. When the light-source semiconductor element without any cover of a sealing resin having high gas barrier properties is turned on at a room temperature and in a humidity of 85%, 90% of the light emission intensity of the light-source semiconductor element is maintained for 1200 hours. On the other hand, light-source semiconductor element 10 in this embodiment can maintain 90% of the light-emission intensity for 2500 hours under the same conditions.

Fourth Embodiment

Figure 13:
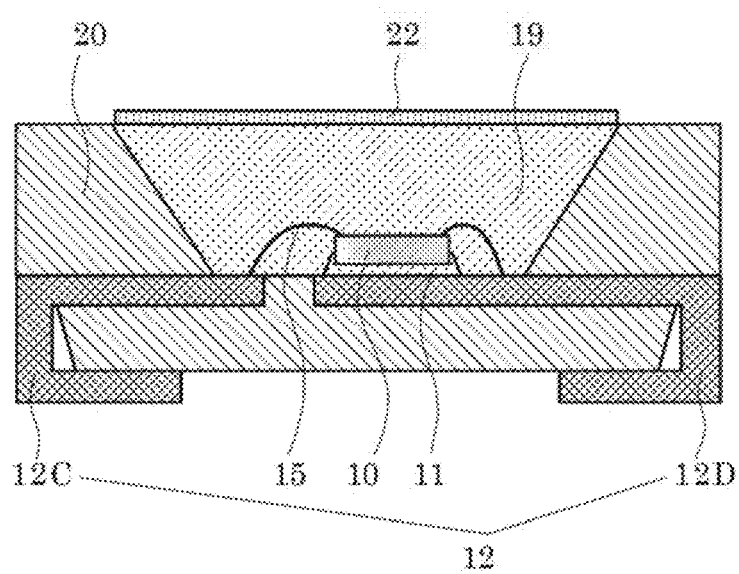
FIG. 13 is a cross-sectional view of a light-source semiconductor device according to a fourth embodiment.

FIG. 13 is a cross-sectional view of a structure of a light-source semiconductor device according to a fourth embodiment. The fourth embodiment is different from the second embodiment in that: resin composition 22 includes an inorganic filler mixed therein, and protects phosphor-containing sealing resin 19 that fills a recessed portion of resin container 20; and in that a second alkoxysilane has a different composition. The fourth embodiment is the same in the other points. The same points as in the second embodiment are not described repeatedly.

The semiconductor device according to the fourth embodiment includes: lead frame 12 including at least lead portions 12C and 12D; resin container 20 having a recessed portion; light-source semiconductor element 10 disposed inside resin container 20 and mounted on lead portion 12D via a die bond material; metal wire 15 that electrically connects light-source semiconductor element 10 and lead portions 12C and 12D, phosphor-containing sealing resin 19, and resin composition 22 that covers phosphor-containing sealing resin 19 so that phosphor-containing sealing resin 19 does not come in contact with the atmosphere. Furthermore, resin composition 22 includes inorganic filler having a close refractivity mixed thereto.

In the fourth embodiment, it is only necessary that resin composition 22 be prepared to contain an inorganic filler using, as a starter, one or more alkoxysilanes of at least one kind including reactive organic functional groups, and be disposed on phosphor-containing sealing resin 19. With this structure, it is possible to reduce water and corrosive gases that invade into phosphor-containing sealing resin 19, and to thereby reduce change in the color of the silver-plated portions of lead portions 12C and 12D and silver-plated surface 51 of the recessed portion of resin container 20 when a corrosive gas is particularly a sulfide gas such as a sulfide hydrogen. Therefore, the light-emission semiconductor device can have a long life. In addition, since resin composition 22 includes the inorganic filler mixed therein, it is possible to reduce occurrence of cracks etc. caused by shrinking in dehydrative condensation of resin composition 22 to be described later, and to thereby form a cured film having higher gas barrier properties.

Method for Manufacturing Light-Source Semiconductor Device

Figure 14:
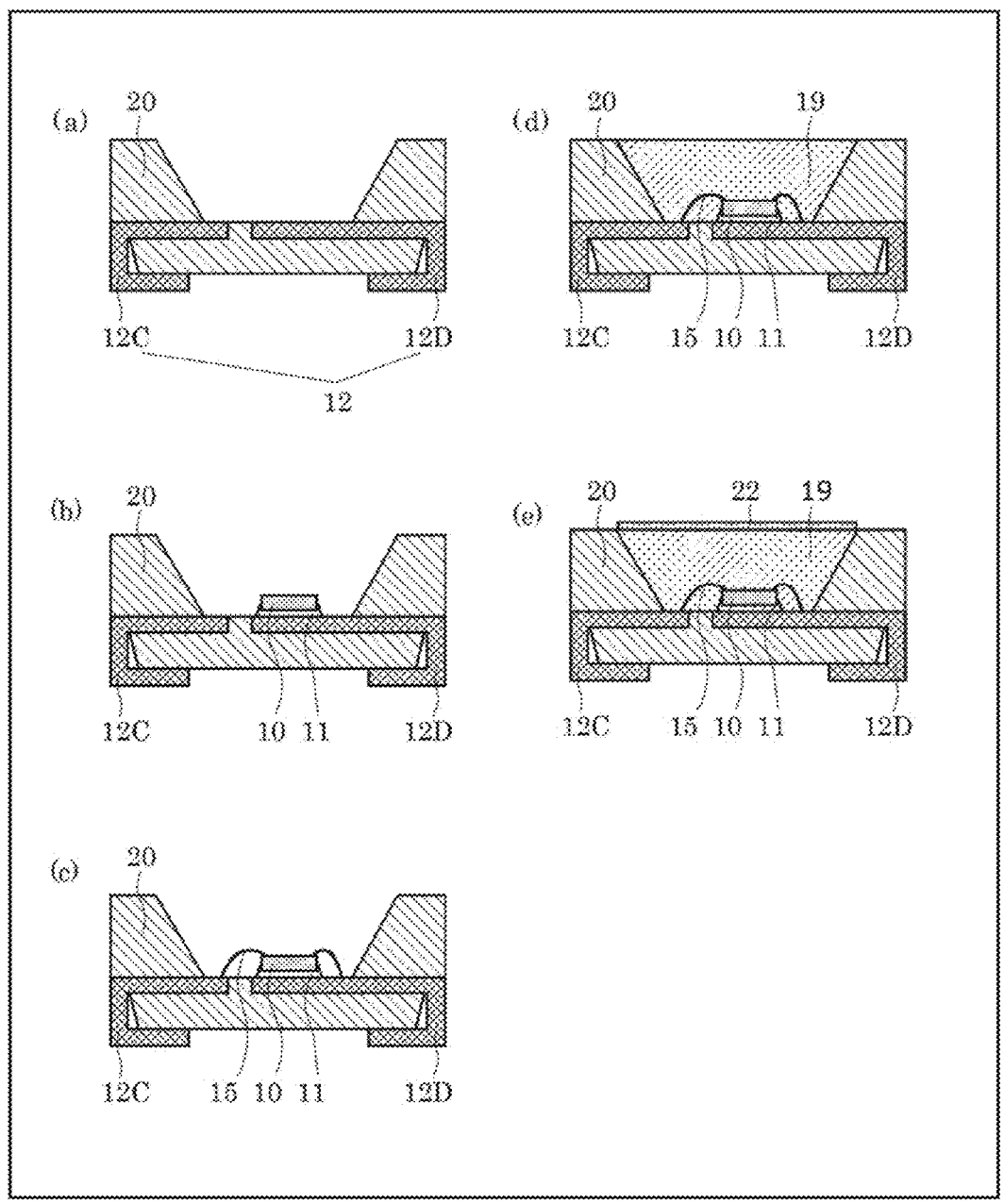
In FIG. 14, each of (a) to (e) is a cross-sectional view of components to be assembled in an assembling process included in a manufacturing method according to the fourth embodiment.

As a manufacturing method according to the fourth embodiment, for example, the next-described manufacturing method is possible. Resin composition 22 and the manufacturing method thereof can be the same as in the second embodiment of the present disclosure. In FIG. 14, (a) to (e) are each a cross-sectional view of components to be assembled in an assembling process included in the manufacturing method in the fourth embodiment.

Method for Manufacturing Resin Composition 22

First, a method for manufacturing resin composition 22 is described. First, an oligomer is prepared from an alkoxysilane having a reactive organic functional group. Next, a second alkoxysilane is added to the oligomer, and thereby a sol solution is prepared. Furthermore, in this embodiment, a filler having a refractivity close to that of resin composition 22 is mixed to the sol solution.

A specific manufacturing method is described below.

(1) Preparation of Oligomer

As the first metal alkoxide, a mixed solution is prepared by a mixing glycidoxypropyltrimethoxysilane of 30 g and an amino catalyser of 1 g. Here, glycidoxypropyltrimethoxysilane has glycidoxy groups as reactive organic functional groups and contains silicon as a metal. The solution is left in a closed system for 24 hours at a room temperature, so as to accelerate polymerization of the glycidoxypropyl groups to be an oligomer. The metal alkoxides are non-limiting examples, and the metal atoms may be replaced with titanium atoms, aluminium atoms, or the like. Reactive organic functional groups may be replaced with cyclic ether such as epoxy cyclohexyl groups and groups containing derivatives thereof, styryl groups, acrylate groups, methyl methacrylate groups, vinyl groups, alkynyl groups, derivatives having a double or triple bonded structure and derivative-containing groups of any of them, thiol propyl groups, amino propyl groups, or the like, and may be a combination of two or more kinds thereof.

Styryl groups, acrylate groups, methyl methacrylate groups, vinyl groups, and derivatives thereof are suitable because they can form a polyolefin structure in a resin composition through radial polymerization. Thiol propyl groups and amino propyl groups when co-used with glycidoxypropyl groups is suitable because they can accelerate polymerization of the glycidoxypropyl groups.

There is no limitation to amine catalysers, and any amine catalyser that can cause ring-opening polymerization of the glycidoxy groups is possible. For example, any of the following are possible: (i) chain aliphatic amines including alkylamines such as an ethylenediamine, a diethylenetriamine, a triethylenetetramine, a tetraethylenepentamine, a dipropylenediamine, and a diethylaminopropyl amine; (ii) cyclic aliphatic amines including an N-aminoethylpiperazine, a menthene diamine, an isophoronediamine, an ethylenediamine, a diethylenetriamine, and a triethylenetetramine; and (iii) aromatic amines including an m-xylenediamine, an amine black, a methaphonylenediamine, a diaminodiphenylmethan, and a diaminodiphenyl sulfone.

(2) Preparation of Sol

As the second metal alkoxide, a mixture of a dimethyldiethoxysilane of 17.7 g and a phenyltrimethoxysilane of 12.2 g is added to an oligomer of 22 g at a room temperature, and is then left in a closed system for 24 hours, so that a sol solution is prepared.

(3) Addition of Filler

Resin composition 22 contains a filler for the purpose of adding strength and preventing cracks from occurring due to shrinkage that is caused at the time of dehydrative condensation. When the filler is added, it is possible to add the filler to the sol solution obtained in the manner as described above, and disperse it according to a method using a rotary impeller, a magnetic stirrer, or the like. As a filler, it is possible to use a silica filler as a material having a refractivity close to that of resin composition 22 so as not to decrease the clarity as described later, or use a fused silica, a crushed filler, or the like.

In addition, it is suitable that the surface of the silica filler be processed using an alkoxysilane because the compatibility between the processed surface and resin composition 22 is increased, and coalescence of filler grains is reduced. The average grain diameter of the filler can be in a range from 0.2 μm to 100 μm.

When the grain diameter is smaller than 0.2 μm, the grains are easy to coalesce and difficult to disperse evenly, and to thus become whitish. When the grain diameter is smaller than 100 μm, the grains dramatically precipitate and thus difficult to disperse evenly.

The clarity of resin composition 22 needs to be maintained even after the dispersion, and this need can be satisfied by using a filler having a refractivity ranging from 1.3 to 1.6 that is close to the refractivity of resin composition 22. The clarity can be increased by using a filler having a refractivity ranging from 1.4 to 1.5.

As for the addition amount of the filler, the weight of the filler can be in a range from 1% to 70% with respect to the weight of the sol prepared as in the above, and the weight of the filler can preferably be in a range from 2% to 50% with respect to the same.

When the weight of the filler is smaller than 1%, cured resin composition 22 does not have a sufficient strength. When the weight of the filler is larger than 70%, the filler grains are easy to coalesce and difficult to maintain the clarity. A weight of 2% or larger is preferable because the filler increases the gas barrier properties. A weight of 50% or smaller is preferable because the filler makes easier to maintain the dispersibility and the clarity.

The fillers are non-limiting examples, and it is possible to use any other filler having a refractivity ranging from 1.3 to 1.6 that is closer to the refractivity of resin composition 22. Examples of fillers for use as a replacement for the silica filler include: an aluminite, a fluorinated soda, a fluorinated calcium, a fluorinated lanthanum, a fluorinated lithium, a fluorinated magnesium, a fluorinated strontium, an anhydrous silica, a zeolite, a kaolin, a talc, a sericite, a polyethylene, a polymethyl methacrylate, and a vinyl resin.

In order to increase the dispersibility of a filler, a volatile organic solvent may be added, so that a filler sol solution is prepared. In this embodiment, a fused spherical silica filler having an average grain diameter of 200 nm and a refractivity of 1.47 is mixed because the refractivity is close to the refractivity of resin composition 22 and thus the clarity is easily maintained. The mixture ratio of the fused spherical silica filler with respect to the sol solution is 2.5 g:10 g.

(4) Assembling of Components

First, mold-injection of a white resin is performed as illustrated in (a) of FIG. 14 to form resin container 20 having a recessed portion in lead frame 12 into which lead portions 12C and 12D are integrated. Next, in the bottom surface of the recessed portion of resin container 20, light-source semiconductor element 10 is mounted on lead portion 12D for a cathode via paste material 11 through curing of a die bond and paste material 11 ((b) in FIG. 14). The electrodes of light-source semiconductor element 10 are respectively connected using metal wire 15 according to a wire bonding method ((c) of FIG. 14).

Next, paste material 11 that is a mixture of phosphors and an uncured sealing resin are filled in the recessed portion of resin container 20 by an appropriate amount using a dispenser. Subsequently, paste material 11 is thermoset to form phosphor-containing sealing resin 19 ((d) of FIG. 14).

(5) Formation of Resin Composition 22

The sol solution in which the filler is mixed is dropped at places exposed to the atmosphere in an upper portion of phosphor-containing sealing resin 19, is left in the atmosphere for at least 1 hour, so that the sol solution is cured. In the dropped sol solution, alkoxy groups made from alkoxysilane that is one of row materials is hydrolysed by water molecules in the atmosphere to be silanol groups, and the silanol groups are dehydrated and condensed to form a siloxane skeleton.

As a result, resin composition 22 provides a high crosslinking density as a whole because of its three-dimensional network polymer that is a mixture of polymerization chains of reactive organic functional groups formed in the process in the above (1) and the siloxane skeleton. Furthermore, in the three-dimensional network polymer, phosphor-containing sealing resin 19 is covered by resin composition 22 (i) including the silica filler mixed thereto to reduce shrinking of resin composition 22 in the dehydrative condensation and (ii) is resistant to cracks ((e) of FIG. 14).

Through the above manufacturing method, the light-source semiconductor device is formed to have phosphor-containing sealing resin 19 covered by resin composition 22 that (i) includes the inorganic filler mixed thereto so as to be resistant to cracks, have a high crosslinking density and high gas barrier properties. Thus, the light-source semiconductor device is protected against water and corrosive gases that diffuse and invade to resin composition 22, so that the light-source semiconductor device is resistant to (i) breakage due to water and corrosive gases and (ii) change in the color of the silver-plated portions of lead portions 12C and 12D and silver-plated surface 51 of the recessed portion of resin container 20. Accordingly, the light-source semiconductor device has a high reliability and a long life.

Effects

With the above effects, the light-source semiconductor device according to this embodiment can maintain the light-emission intensity during the long life, compared to a light-source semiconductor device having phosphor-containing sealing resin 19 whose surface is not covered by resin composition 22. When the light-source semiconductor device in which phosphor-containing sealing resin is not covered by resin composition 22 is turned on at a temperature of 85 degrees Celsius and a humidity of 85%, the light-source semiconductor device maintains 90% of the light-emission intensity for 1200 hours. On the other hand, the light-source semiconductor device in this embodiment can maintain 90% of the light-emission intensity for 1500 hours under the same conditions.

Fifth Embodiment

Figure 15:
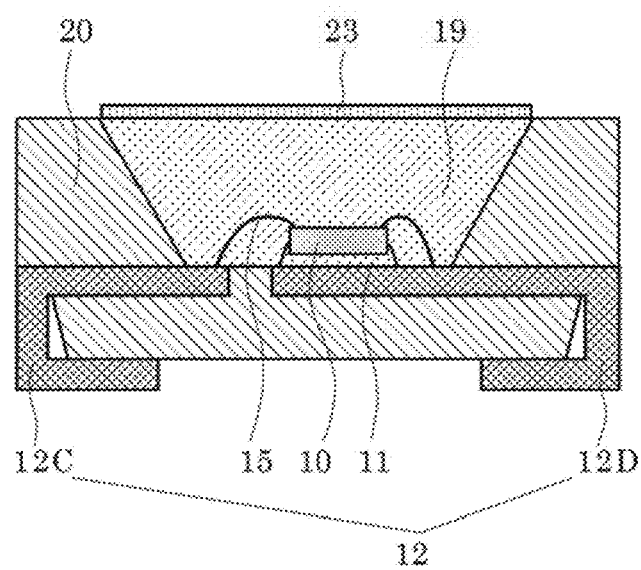
FIG. 15 is a cross-sectional view of a light-source semiconductor device according to a fifth embodiment.

FIG. 15 is a cross-sectional view of a structure of a light-source semiconductor device according to a fifth embodiment. The fifth embodiment is different from the second embodiment in that: reactive organic functional groups in an alkoxysilane are radically polymerizable reactive functional groups, and a second alkoxysilane has a different composition. Here, the reactive organic functional groups are a starter of resin composition 23. The fifth embodiment is the same as in the second embodiment in the other points. The same points are not described repeatedly.

The semiconductor device according to the fifth embodiment includes: lead frame 12 including at least lead portions 12C and 12D; resin container 20 having a recessed portion; light-source semiconductor element 10 disposed inside resin container 20 and mounted on lead portion 12D via a die bond material; metal wire 15 that electrically connects light-source semiconductor element 10 and lead portions 12C and 12D, phosphor-containing sealing resin 19, and resin composition 23 that covers phosphor-containing sealing resin 19 so that phosphor-containing sealing resin 19 does not come in contact with the atmosphere.

In the fifth embodiment, an alkoxysilane of at least one kind containing reactive organic functional groups is used as the starter. Here, the reactive organic functional groups are radically polymerizable reactive functional groups. At the time of preparing resin composition 23, the radically polymerizable reactive functional groups are cured by ultraviolet rays or the like in advance, so as to be an oligomer. This oligomer is swollen in an alkoxysilane liquid of an identical or different kind so as to be a sol solution. Resin composition 23 prepared through a sol-gel reaction of the sol solution may be disposed on phosphor-containing sealing resin 19.

Here, radically polymerizable reactive functional groups mean organic functional groups that can polymerize through radical polymerization that is initiated by irradiating heat or light, or using a radial polymerization initiator, and that can be, for example, (metha)acryloyl groups, (metha)acryloyloxy groups, (metha)acryloyl amino groups, vinyl aryl groups, vinyl ether groups, vinyl oxycarbonyl groups, or the like.

With this structure, it is possible to reduce water and corrosive gases from invading into phosphor-containing sealing resin 19.

In particular, when a corrosive gas is a sulfide gas such as a hydrogen sulfide, it is possible to reduce change in the color of silver-plated portions of lead portions 12C and 12D and silver-plated surface 51 of the recessed portion of resin container 20, and to prolong the life of the light-emitting semiconductor device.

Furthermore, when preparing the oligomer in the process of preparing resin composition 23, it is possible to prepare it quickly by irradiating ultraviolet rays or the like, and thus to prepare the cured film having high gas barrier properties with an increased productivity.

Method for Manufacturing Light-Source Semiconductor Device

Figure 16:
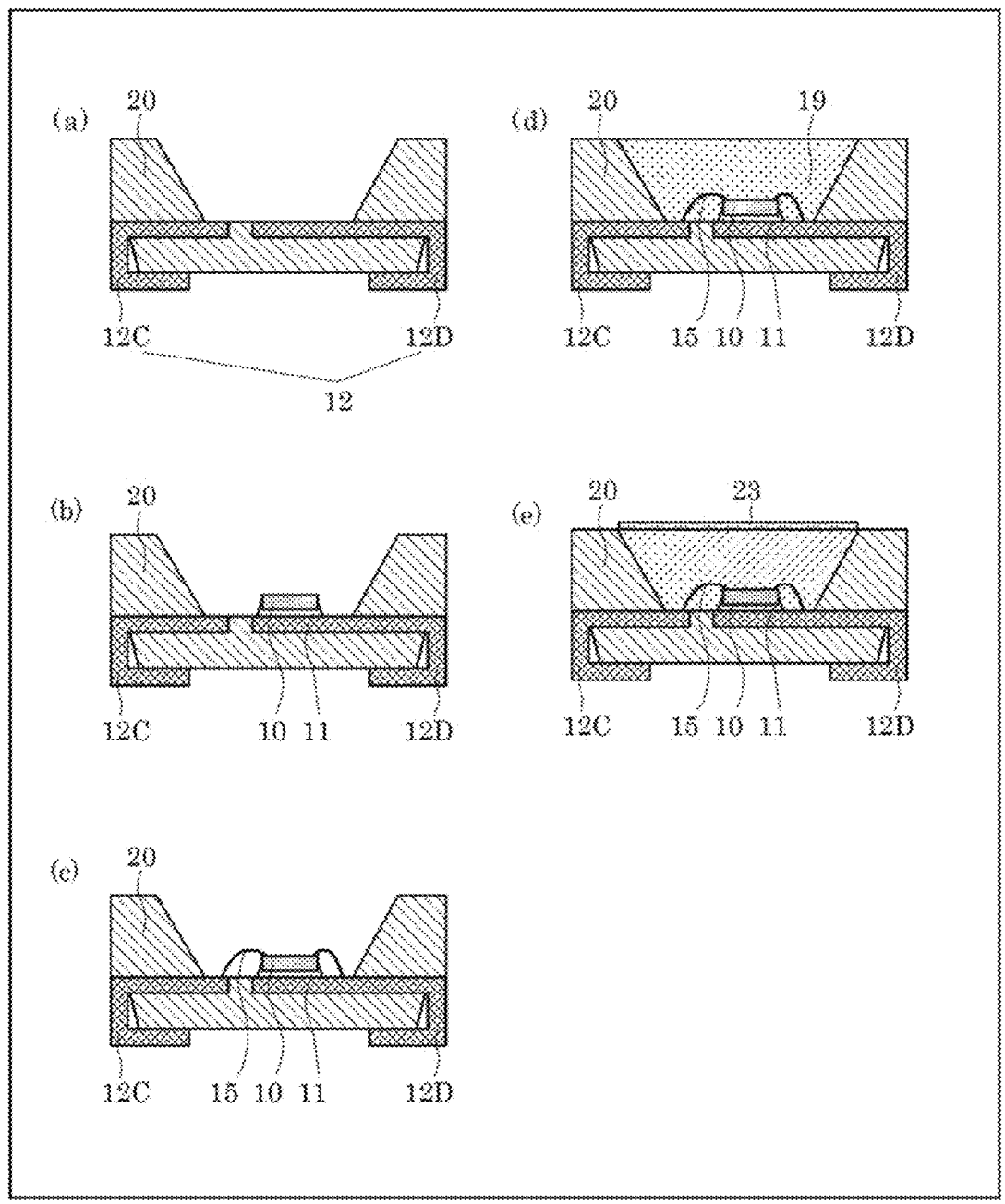
In FIG. 16, each of (a) to (e) is a cross-sectional view of components to be assembled in an assembling process included in a manufacturing method according to the fifth embodiment.

As a manufacturing method in the fifth embodiment, for example, the next-described manufacturing method is possible. Resin composition 23 and the manufacturing method thereof can be the same as in the first and second embodiments of the present disclosure. In FIG. 16, (a) to (e) are each a cross-sectional view of components to be assembled in an assembling process included in the manufacturing method according to the fifth embodiment.

First, a method for manufacturing resin composition 23 is described. First, an oligomer is prepared from an alkoxysilane having reactive organic functional groups. Next, a second alkoxysilane is added to the oligomer, so that a sol solution is prepared.

A specific manufacturing method is described below.
(1) Preparation of Oligomer

A mixed solution is prepared by mixing a styryltrimethoxysilane (Chemical Formula 5) containing styryl groups as reactive organic functional groups and a benzoyl peroxide as a polymerization initiator in the amounts of 30 g and 0.1 g, respectively. Subsequently, untraviolet rays are irradiated on the mixed solution for approximately 1 minute to accelerate radical polymerization of the styryl groups and to thereby prepare an oligomer (Chemical Formula 6).

Reactive organic functional groups are not limited thereto, and any reactive organic functional groups that can induce radical polymerization are possible. Examples of other radically polymerizable reactive functional groups include compounds or the like each containing, per molecule, at least one of the following radically polymerizable reactive functional groups: a (metha)acryloyl group; a (metha)acryloyloxy group, a (metha)acryloyl amino group, a vinyl aryl group, a vinyl ether group, a vinyl oxycarbonyl group, or the like. Two or more kinds of the radically polymerizable reactive functional groups may be combined.

[Chemical Formula 5]

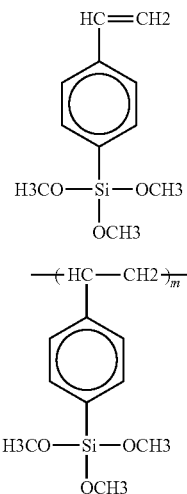

[Chemical Formula 6]

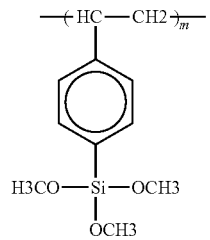

In this embodiment, a polymerization initiator may be added or may not be added.

A thermal polymerization initiator, a photopolymerization initiator, or the like that can induce radical polymerization can be used as the polymerization initiator.

Thermal polymerization initiators are, for example, organic peroxides, azo compounds (initiators of azo-based radical polymerization). Organic peroxides are, for example, ketone peroxides, dialkyl peroxides, diacyl peroxides (benzoyl peroxides, etc.), percarbonates, hydroperoxides, peroxy ketals, and alkyl peresters. Azo compounds are, for example, 2-Azobis, 4-dimethylvaleronitrile, azobisisobutyronitrile (AIBN), and dimethyl 2,2'-azobis(isobutyrate).

Among these, organic peroxides, particularly any of peroxide radical polymerization initiators such as dialkyl peroxides represented by benzoyl peroxides can be preferably used because such an initiator does not cause bubbles when a radically polymerizable resin composition is cured.

Photopolymerization initiators are, for example, dimethoxyacetophenones, diethoxyacetophenones, benzophenones, benzyl dimethyl ketones, acetophenon benzyls, benzoin methyl ethers, benzoin ethyl ethers, benzoin isopropyl ethyl ethers, diphenyl sulfites, and dimethoxy phenyl acetophenones. Two or more kinds of photopolymerization initiators may be combined.

When a polymerization initiator is added to a radically polymerizable resin composition, the amount of the polymerization initiator is approximately 0.01 to 50 weight %, and preferably approximately 1 to 20 weight % with respect to a radically polymerizable compound (a total weight of the radically polymerizable resin and the other radically polymerizable compound) in the radically polymerizable resin composition.

(2) Preparation of Sol

As the second metal alkoxysilane, a mixture of a dimethyldiethoxysilane of 17.7 g and a phenyltrimethoxysilane of 12.2 g is added to an oligomer of 22 g at a room temperature, and is then left in a closed system for 24 hours, so that a sol solution is prepared.

(3) Assembling of Components

First, mold-injection of a white resin is performed as illustrated in (a) of FIG. 16 to form resin container 20 having a recessed portion in lead frame 12 into which lead portions 12C and 12D are integrated. Next, in the bottom surface of the recessed portion of resin container 20, light-source semiconductor element 10 is mounted on lead portion 12D for a cathode via paste material 11 through curing of a die bond and the paste material 11 ((b) in FIG. 16). The electrodes of light-source semiconductor element 10 and lead portions 12C and 12D are connected using metal wire 15 according to a wire bonding method ((c) of FIG. 16).

Next, paste material 11 that is a mixture of phosphors and an uncured sealing resin are filled in the recessed portion of resin container 20 by an appropriate amount using a dispenser. Subsequently, paste material 11 is thermoset to form phosphor-containing sealing resin 19 ((d) of FIG. 16).

(4) Formation of Resin Composition 23

The sol solution in which the filler is mixed is dropped at places exposed to the atmosphere in an upper portion of phosphor-containing sealing resin 19, is left in the atmosphere for at least 1 hour, so that the sol solution is cured. In the dropped sol solution, alkoxy groups made from an alkoxysilane that is one of row materials is hydrolysed by water molecules in the atmosphere to be silanol groups. Through dehydrative condensation between the silanol groups, a siloxane skeleton is formed.

As a result, phosphor-containing sealing resin 19 is to be covered by resin composition 23 that provides a high crosslinking density as a whole because of its three-dimensional network polymer structure that is a mixture of polymerization chains of reactive organic functional groups formed in the process in the above (1) and the siloxane skeleton ((e) in FIG. 16).

Through the above manufacturing method, in the light-source semiconductor device: phosphor-containing sealing resin 19 is covered by resin composition 23 that provides a high crosslinking density and high gas barrier properties because of its three-dimensional network polymer structure that is the mixture of radical polymerization chains of the radically polymerizable functional groups and the siloxane skeleton. As a result, the light-source semiconductor device can be protected against water and corrosive gases that diffuse and invade, so that the light-source semiconductor device is resistant to (i) breakage due to such water and corrosive gases and (ii) change in the color of the silver-plated portions of lead portions 12C and 12D and silver-plated surface 51 of the recessed portion of resin container 20. Accordingly, the light-source semiconductor device has a high reliability and a long life.

Effects

The structure in the fifth embodiment having the above effects can maintain the light-emission intensity during the long life, compared to a light-source semiconductor device having phosphor-containing sealing resin 19 whose surface is not covered by resin composition 23. When the light-source semiconductor device having phosphor-containing sealing resin 19 whose surface is not covered by resin composition 16 is turned on at a temperature of 85 degrees Celsius and a humidity of 85%, the light-source semiconductor device maintains 90% of the light-emission intensity for 1200 hours. On the other hand, the light-source semiconductor device in the fifth embodiment can maintain 90% of the light-emission intensity for 1300 hours.

It is to be noted that the first to fifth embodiments can be arbitrarily combined. Light-source semiconductor element 10 may be not only a light-source semiconductor element, but also a semiconductor element for other use.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

As described above, protective films and semiconductor devices using the protective films according to the present disclosure are used widely as semiconductor devices having a high reliability.

What is claimed is:

1. A resin composition comprising:
an oligomer of a first metal alkoxide containing a reactive organic functional group, the oligomer being formed through polymerization of the reactive organic functional group;
a second metal alkoxide of at least one kind, the second metal alkoxide forming a siloxane skeleton with the oligomer, wherein the reactive organic functional group comprises a glycidoxy group.

2. The resin composition according to claim 1,
wherein the first metal alkoxide is alkoxysilane, and
the alkoxysilane contains an alkoxy group having a carbon number of 1 to 5 inclusive.

3. The resin composition according to claim 2,
wherein an organic reactive group bonded with the alkoxysilane has a carbon number of 1 to 10 inclusive.

4. A semiconductor device comprising:
a semiconductor element mounted on a substrate; and
a protective film comprising the resin composition according to claim 1,
wherein the semiconductor element is protected by the protective film.

5. A semiconductor device comprising:
a semiconductor element mounted on a substrate;
a phosphor-containing resin which protects the semiconductor element; and
the resin composition according to claim 1, the resin composition protecting the phosphor-containing resin.

6. A semiconductor device comprising:
a resin container having a recessed portion;
a semiconductor element disposed in the recessed portion; and
the resin composition according to claim 1, the resin composition being disposed in the recessed portion and covering the semiconductor element,
wherein the resin composition includes a phosphor.

7. The resin composition according to claim 1,
wherein the second metal alkoxide includes hydrocarbon radicals.

8. The resin composition according to claim 1,
wherein the second metal alkoxide is represented as $E_pF_qG_rM(OR1)_l(OR2)_m(OR3)_n$ where: E, F, and G are hydrocarbon radicals and R is an alkyl group; p, q, r, l, m, and n are each an integer; (p+q+r) and (l+m+n) are each an integer of 1 to 3; p+q+r+l+m+n=4; and M denotes silicon, titanium, aluminium, zirconium, or stannum.

9. The resin composition according to claim 8,
wherein each of E, F, and G is a carbon hydride having a carbon number of 1 to 10.

10. The resin composition according to claim 8,
wherein R is a carbon hydride having a carbon number of 1 to 5.

11. The resin composition according to claim 1,
wherein the oligomer is not hydrolyzed.

12. A method for manufacturing a resin composition, the method comprising:

polymerizing a reactive organic functional group in a first metal alkoxide; and causing sol-gel reaction of the reactive organic functional group polymerized in the first metal alkoxide, using a second metal alkoxide of at least one kind, wherein the reactive organic functional group comprises a glycidoxy group.

13. A method for manufacturing the resin composition according to claim 12,
wherein the reactive organic functional group polymerized in the polymerizing is not hydrolyzed.

* * * * *